United States Patent
Granstrom et al.

(10) Patent No.: US 7,385,220 B2
(45) Date of Patent: Jun. 10, 2008

(54) FIBER HAVING DIELECTRIC POLYMERIC LAYER ON ELECTRICALLY CONDUCTIVE SURFACE

(75) Inventors: Jimmy Granstrom, New Providence, NJ (US); Howard Edan Katz, Summit, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 761 days.

(21) Appl. No.: 10/822,510

(22) Filed: Apr. 12, 2004

(65) Prior Publication Data

US 2005/0227059 A1    Oct. 13, 2005

(51) Int. Cl.
*H01L 29/08* (2006.01)
*H01L 35/04* (2006.01)
*H01L 51/00* (2006.01)
*H01L 21/00* (2006.01)
*B01J 21/08* (2006.01)
*B23B 23/02* (2006.01)

(52) U.S. Cl. .............. 257/40; 257/213; 257/E51.038; 438/99; 438/197; 428/292.1; 502/240

(58) Field of Classification Search ............ 438/99; 257/40; 428/292.1
See application file for complete search history.

(56) References Cited

U.S. PATENT DOCUMENTS

| 5,347,144 | A | | 9/1994 | Garnier et al. | ............... 257/40 |
|---|---|---|---|---|---|
| 5,625,199 | A | | 4/1997 | Baumbach et al. | ............ 257/40 |
| 5,981,970 | A | | 11/1999 | Dimitrakopoulos et al. | ... 257/40 |
| 6,081,249 | A | * | 6/2000 | Harris | ...................... 345/85 |
| 6,541,416 | B2 | * | 4/2003 | Ishikawa et al. | ............ 502/240 |
| 2004/0166347 | A1 | * | 8/2004 | Nieminen | .................... 428/500 |
| 2007/0031662 | A1 | * | 2/2007 | Devaux et al. | .............. 428/357 |

OTHER PUBLICATIONS

Louay Eldada, "Optical Networking Components," DuPont Photonics Technologies, 100 Fordham Road, Wilmington, MA 01887 Phone: 978.203.1300, Fax: 978.988.1040, louay.eldada@usa.dupont.com1. http://photonics.dupont.com/downloads/OpticalNetworkingComponents.pdf—393.8KB—All of DuPont!, 22 pgs.

Li et al., "Field-Effect Transistors Based on Thiophene Hexamer Analogues with Diminished Electron Donor Strength", *Chem. Mater.*, vol. 11, pp. 458-465 (1999).

Piner et al., ""Dip-Pen" Nanolithography", *Science*, vol. 283, pp. 661-663 (Jan. 29, 1999).

Limberger et al., "Novel all-fiber devices: phase and amplitude modulators, wavelength tunable filters", *Institute of Applied Optics*, DMT-IOA, EPFL, CH-1015 Lausanne, p. 14 (Jun. 1999).

(Continued)

*Primary Examiner*—William David Coleman

(57) ABSTRACT

Fibers having an electrically conductive outer surface and having an average diameter of less than about 5 millimeters; and a dielectric polymeric layer comprising a polymer having a main polymer chain on the outer surface, the dielectric polymeric layer having a thickness of less than about 50 microns, the main polymer chain comprising carbon. Fiber transistors having an on/off ratio of at least about 10. Techniques for making fibers and fiber transistors.

20 Claims, 9 Drawing Sheets

OTHER PUBLICATIONS

Yin et al., "All-fiber all-optic tunable filter based on the combination of long period grating and photorefractive cladding layer", SPIE Conference 2000, San Diego (2000), 5 pgs.

Klauk et al., "Pentacene organic thin-film transistors and ICs", *Solid State Technology*, pp. 63-76 (Mar. 2000).

Katz et al., "Organic field-effect transistors with polarizable gate insulators", *Journal of Applied Physics*, vol. 91, No. 3, pp. 1572-1576 (Feb. 1, 2002).

Limberger et al., "Novel all-fiber devices: phase modulators, wavelength tunable filters, fiber lasers", *Institute of Applied Optics*, DMT-IOA, EPFL, CH-1015 Lausanne, p. 1 (May 2002).

Knipp et al., "Morphology and electronic transport of polycrystalline pentacene thin-film transistors", *Applied Physics Letters*, vol. 82, No. 22, pp. 3907-3909 (Jun. 2, 2003).

Mushrush et al., "Easily Processable Phenylene—Thiophene-Based Organic Field-Effect Transistors and Solution-Fabricated Nonvolatile Transistor Memory Elements", *J. Am. Chem. Soc.*, vol. 125, pp. 9414-9423 (2003).

Bonderover et al., "Amorphous Silicon Thin Film Transistors on Kapton Fibers", *Mat. Res. Soc. Symp. Proc.*, vol. 736, pp. D2.5.1-D2.5.6 (2003).

Lee et al., "Organic Transistors on Fiber: A first step towards electronic textiles", *IEEE* (Mar. 2003), 4 pgs.

Lucchetta et al., "Wavelength flipping in laser emission driven by a switchable holographic grating", *Applied Physics Letters*, vol. 84, No. 6, pp. 837-839 (Feb. 9, 2004).

* cited by examiner

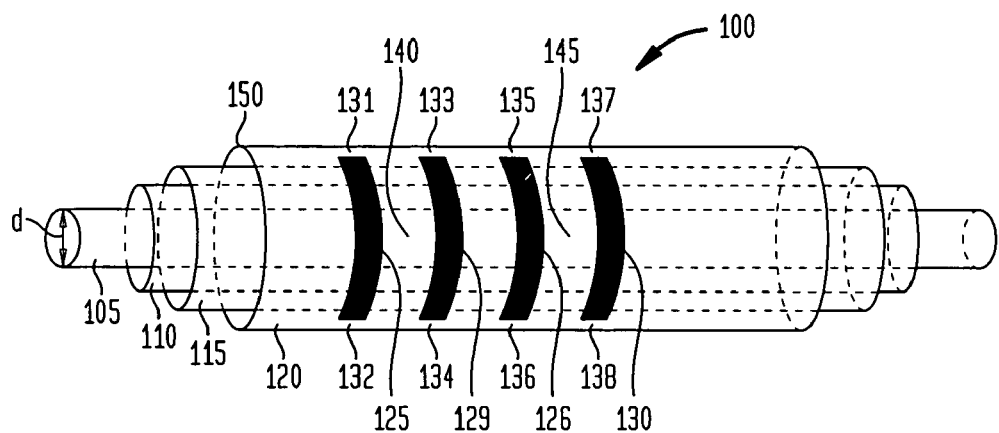
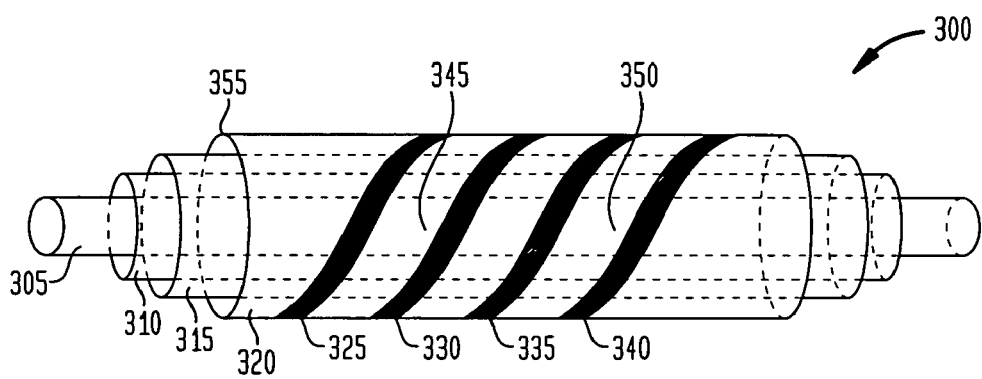

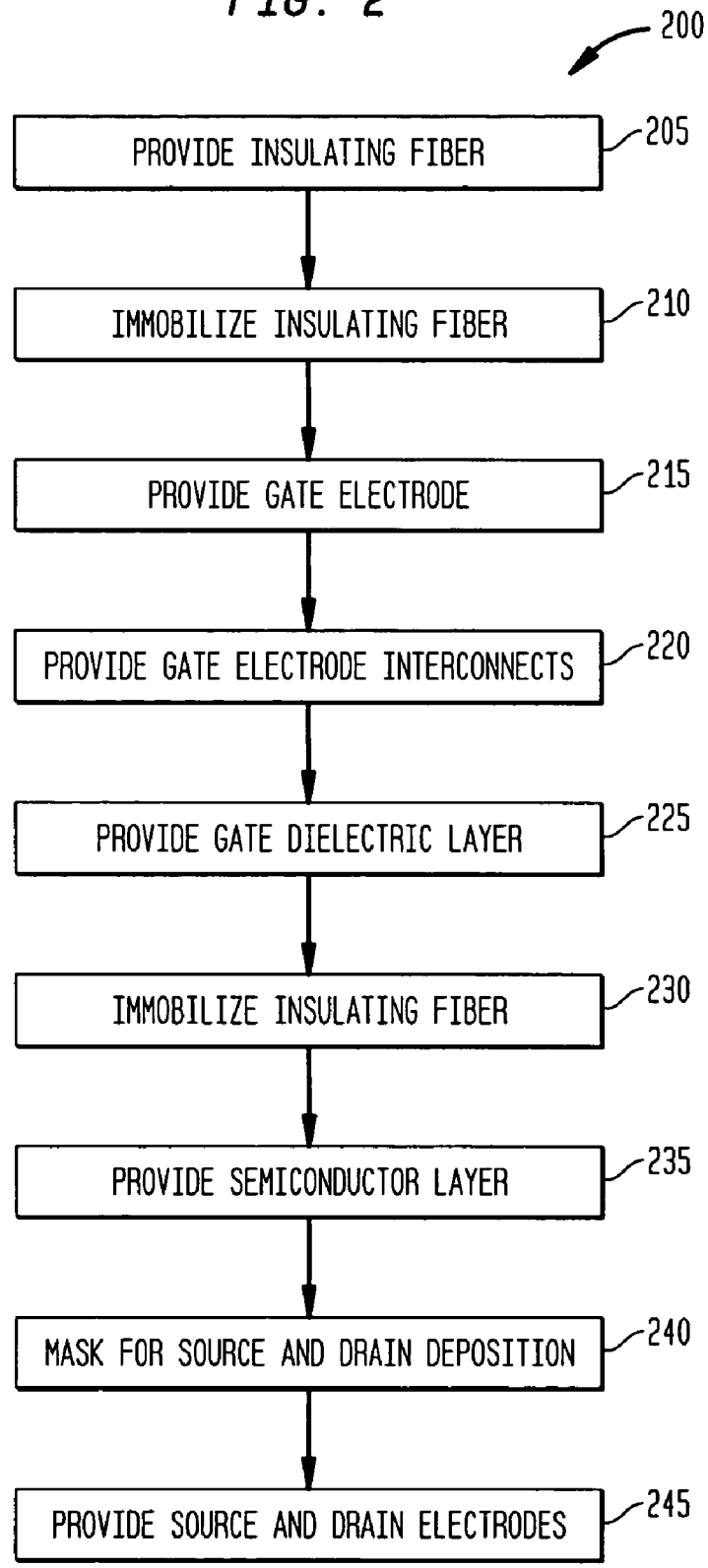

FIBER HAVING DIELECTRIC POLYMERIC LAYER ON ELECTRICALLY CONDUCTIVE SURFACE

FIELD OF THE INVENTION

The present invention generally relates to the field of fibers provided with polymeric coatings.

BACKGROUND OF THE INVENTION

Transistors are ubiquitous in electronic systems ranging from supercomputers to cellular telephones. For example, transistors facilitate the creation of sensors, actuators and visual display devices. Further distribution of transistors and other electronic devices in service of new end-use applications is desirable.

There is accordingly a need for suitable processes for producing transistors and other electronic devices on diverse substrates, and for the resulting transistors and other electronic devices.

SUMMARY OF THE INVENTION

The present invention provides fibers having an electrically conductive outer surface and having an average diameter of less than about 5 millimeters; and a dielectric polymeric layer comprising a polymer having a main polymer chain on the outer surface, the dielectric polymeric layer having a thickness of less than about 50 microns, the main polymer chain comprising carbon. The present invention further provides fiber transistors incorporating further layers into such fibers. Methods for making the fibers and fiber transistors are also provided.

In one embodiment, an apparatus is provided, comprising: a fiber having an electrically conductive outer surface and having an average diameter of less than about 5 millimeters; and a dielectric polymeric layer comprising a polymer having a main polymer chain on said outer surface, said dielectric polymeric layer having a thickness of less than about 50 microns, said main polymer chain comprising carbon.

In another embodiment, a method for making a coated fiber is provided, comprising the steps of: providing a fiber having an electrically conductive outer surface and an average diameter of less than about 5 millimeters; and forming a dielectric polymeric layer comprising a polymer having a main polymer chain on said outer surface, said dielectric polymeric layer having a thickness of less than about 50 microns, said main polymer chain comprising carbon.

In a further embodiment, a fiber transistor is provided, comprising: an insulating fiber having an average diameter of less than about 5 millimeters; a gate electrode on said insulating fiber; a dielectric polymeric layer comprising a polymer having a main polymer chain on said gate electrode, the dielectric polymeric layer having a thickness of less than about 50 microns, said main polymer chain comprising carbon; a semiconductor layer and source and drain electrodes on said dielectric polymeric layer, said source and drain electrodes being in contact with said semiconductor layer; said fiber transistor having an on/off ratio of at least about 10.

In an additional embodiment, a fiber transistor is provided, comprising: an insulating fiber having an average diameter of less than about 5 millimeters; a semiconductor layer and source and drain electrodes on said insulating fiber, said source and drain electrodes being in contact with said semiconductor layer; a dielectric polymeric layer comprising a polymer having a main polymer chain on said semiconductor layer, the dielectric polymeric layer having a thickness of less than about 50 microns, said main polymer chain comprising carbon; and a gate electrode on said dielectric polymeric layer; said fiber transistor having an on/off ratio of at least about 10.

In another embodiment, a method for making a fiber transistor is provided, comprising the steps of: providing an insulating fiber having an average diameter of less than about 5 millimeters; forming a gate electrode on said insulating fiber; forming a dielectric polymeric layer comprising a polymer having a main polymer chain on said gate electrode, the dielectric polymeric layer having a thickness of less than about 50 microns, said main polymer chain comprising carbon; forming a semiconductor layer and a source electrode and a drain electrode on said dielectric layer, said source and drain electrodes being in contact with said semiconductor layer; in which said fiber transistor has an on/off ratio of at least about 10.

In a further embodiment, a method for making a fiber transistor is provided, comprising the steps of: providing an insulating fiber having an average diameter of less than about 5 millimeters; forming a semiconductor layer and source and drain electrodes on said insulating fiber, said source and drain electrodes being in contact with said semiconductor layer; forming a dielectric polymeric layer comprising a polymer having a main polymer chain on said semiconductor layer, the dielectric polymeric layer having a thickness of less than about 50 microns, said main polymer chain comprising carbon; and forming a gate electrode on said dielectric polymeric layer; said fiber transistor having an on/off ratio of at least about 10.

A more complete understanding of the present invention, as well as further features and advantages of the invention, will be apparent from the following Detailed Description and the accompanying drawings.

BRIEF DESCRIPTION OF THE DRAWINGS

FIG. 1 shows a perspective view of an embodiment of a fiber transistor according to the present invention;

FIG. 2 shows a process for making the fiber transistor of FIG. 1;

FIG. 3 shows a perspective view of a further embodiment of a fiber transistor according to the present invention;

DETAILED DESCRIPTION

Figure 4:
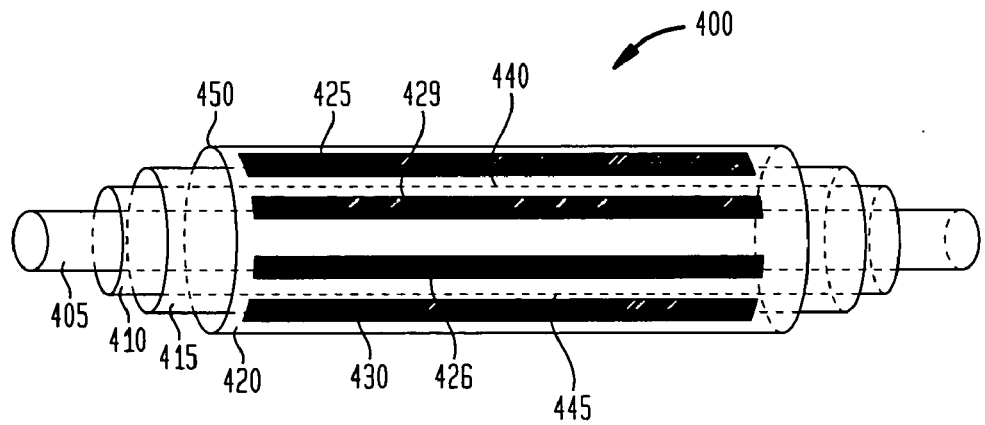
FIG. 4 shows a perspective view of another embodiment of a fiber transistor according to the present invention.

The present invention provides fibers having a charge-carrier conductive outer surface and a diameter of less than about 5 millimeters ("mm") and which are coated with a dielectric polymeric layer that is smooth, thin and continuous. The present invention also provides processes for making such fibers coated with such a dielectric polymeric layer. In a further embodiment, transistors are provided on such fibers. Processes for making such transistors are additionally provided.

FIG. 1 shows an exemplary fiber transistor 100. The fiber transistor 100 comprises an insulating fiber 105, a gate electrode 110, a gate dielectric layer 115, a semiconductor layer 120, source electrodes 125 and 126, and drain electrodes 129 and 130. The gate electrode 110 is in the form of an elongated tubular layer overlaying a portion of the insulating fiber 105. Likewise, the gate dielectric layer 115 is in the form of an elongated tubular layer overlaying a portion of the gate electrode 110. Furthermore, the semiconductor layer 120 in the form of an elongated tubular layer overlaying a portion of the gate dielectric layer 115. Each of such electrodes 125, 126, 129 and 130 is in the shape of an elongated rectangle overlaid on the curved surface of the circumference of the semiconductor layer 120 such that one pair of opposite edges of the rectangle is oriented substantially parallel to the longitudinal axis of the insulating fiber 105 and the other pair, desirably being longer than the one pair, is oriented substantially transverse to such longitudinal axis and substantially coincident with a portion of the circumference of the insulating fiber 105. The source electrodes 125 and 126 are also interleaved with the drain electrodes 129 and 130 on the surface of the semiconductor layer 120, forming two spaced apart channel regions 140 and 145 within the semiconductor layer 120. In this exemplary embodiment, the source electrodes 125 and 126 and the drain electrodes 129 and 130 are placed only on one side of the circumference of the insulating fiber 105, as can be seen by the endpoints 131 and 132 of source electrode 125, the endpoints 133 and 134 of drain electrode 129, the endpoints 135 and 136 of source electrode 126, and the endpoints 137 and 138 of drain electrode 130.

Although the exemplary embodiment includes two source electrodes 125 and 126 and two drain electrodes 129 and 130, a particular device may be provided with only one source electrode 125 and only one drain electrode 129, or any desired larger numbers of source electrodes and drain electrodes. Desirably the source electrodes and drain electrodes are substantially equal in number and arranged in alternating fashion as matched pairs. FIG. 1 further shows that direct electrical connection between the gate electrode 110 and the semiconductor layer 120 is prevented by an interposed exposed region of the gate dielectric layer 115 extending beyond the edge 150 of the semiconductor layer 120. In the above discussion and throughout this specification, layers are referred to as being "on" each other. However, it is to be understood that by this use of "on" is meant that each successive layer surrounds the previous layer on the subject fiber either partially or completely as described, and that additional layers may if desired be interposed between the layers so discussed as being on each other. Such additional interposed layers are contemplated by and are within the scope of the present invention.

The insulating fiber 105 can be any monofilamentary or multifilamentary material suitable to act as a supporting substrate for the gate electrode 110 in the fiber transistor 100, and having a sufficiently smooth surface to enable the application of a substantially continuous coating of an electrically conductive material on the insulating fiber 105 to serve as the gate electrode 110. Multifilamentary materials can be used as the insulating fiber 105 provided that they present surfaces that are sufficiently smooth, orderly and continuous to facilitate application of subsequent material layers of the fiber transistor 100 as defined herein. For example, multiple monofilaments can be juxtaposed together in a mutually parallel manner, a helical manner, or a braided manner.

The term "insulating" herein means that the outer circumference of the subject insulating fiber has an electrical resistance of at least about $1 \times 10^{10}$ ohm centimeters ("cm"), which is equivalent to a leakage current of less than one micro amp when 100 volts ("V") is applied through the thickness of a one micron ("μ", 0.0001 cm) thick film over an area of one square millimeter (0.01 cm$^2$). Desirably, the subject fiber has an electrical resistance of at least about $1 \times 10^{13}$ ohm cm. Broadly, the insulating fiber 105 has a diameter d of less than about 5 mm. In another embodiment, the insulating fiber 105 has a diameter d of less than about 2 mm. In a further embodiment, the insulating fiber 105 has a diameter d of less than about 1 mm. Within the foregoing diameter limits for the insulating fiber 105, high surface tension exists on the tubular circumference of the insulating fiber 105 due to its small, curved structure. The present invention facilitates the provision of a continuous coating on such an insulating fiber 105 as described herein, in spite of this high surface tension.

The insulating fiber 105 can be constituted, for example, by an optical or textile fiber. Optical fibers generally have an outer diameter of less than about 1 mm, typically less than about 0.2 mm, and more typically about 0.125 mm. Suitable textile fibers can include, for example, natural or synthetic fibers such as silk, polyester, rayon, and nylon. Although the outer circumference of the insulating fiber 105 has the electrical resistance as described above, the core of the insulating fiber 105 could, if desired, be capable of conducting electrons. If the surface of the insulating fiber 105 itself is not sufficiently smooth to enable the direct application of a substantially continuous coating of an electrically conductive material to serve as the gate electrode 110, then such fiber may be provided with an interposed planarizing layer suitable to ensure that the protruding regions of the surface of the insulating fiber 105 do not interfere with the application or function of subsequently applied layers of the fiber transistor 100.

The gate electrode 110 is constituted by a layer on the insulating fiber 105 of a material suitable for conducting electrons. The gate electrode 110 has a smooth outer surface within the region over which the channel region of the semiconductor layer 120 between the source electrode 125 and the drain electrode 129, and the channel region between the source electrode 126 and the drain electrode 130, will be overlaid. In this embodiment, the gate electrode 110 is substantially continuous within the bounds of the fiber transistor 100. In another embodiment, however, the gate electrode 110 may be discontinuous provided that the structure is electrically conductive at the locations in the fiber transistor 100 where channel regions of the semiconductor layer 120 are formed. The term "smooth" herein means that the surface so described presents a sufficiently small degree of irregularities so as to provide an adequately low surface tension to permit over-coating of the surface with a substantially continuous gate dielectric layer 115. The term "substantially continuous" regarding the gate dielectric layer 115 herein means that the presence of through holes penetrating from the outer surface of the gate dielectric layer to the inner surface of the gate dielectric layer of the fiber transistor 100 is sufficiently sparse so that the effective resistivity of the gate dielectric layer 115 is substantially maintained in the presence of the semiconductor layer 120, the source electrodes 125 and 126, and the drain electrodes 129 and 130. The gate electrode 110 can, for example, be constituted by a conductive polymer, metal or ceramic. Suitable materials include, for example, noble metals such as gold, silver, platinum, and palladium, other metals such as copper and aluminum, ceramics such as indium tin oxide, and mixtures which may also comprise other elements. Conductive polymers suitable for use in forming gate electrodes include, for example, polyaniline, polypyrrole, polythiophene, and derivatives thereof.

The thickness of the gate electrode 110 on the insulating fiber 105 can be selected as desired depending for example on the end use application for the fiber transistor 100. If the insulating fiber 105 is an optical fiber, the gate electrode 110 may be designed to be sufficiently transparent so that some light can pass through the gate electrode 110. If the insulating fiber 105 is a textile fiber, the gate electrode 110 may be designed to be sufficiently thick so as to contribute tensile strength to the fiber to improve the resistance of the fiber transistor 100 to degradation during use. In one embodiment, the gate electrode 110 desirably has an average thickness within a range of between about 300 Angstroms (Å) and about 20μ. In another embodiment, the gate electrode 110 desirably has an average thickness within a range of between about 500 Å and about 5μ. In a further embodiment, the gate electrode 110 desirably has an average thickness within a range of between about 500 Å and about 1μ. In an additional embodiment, the average gate electrode layer thickness is about 500 Å.

The gate dielectric layer 115 has a thickness of less than about 50μ, has a smooth outer surface, and is substantially continuous. The electrical performance of the fiber transistor 100 strongly depends on the smoothness of the gate dielectric layer 115. See D. Knipp, R. A. Street, and A. R. Volkel, *Morphology and Electronic Transport of Polycrystalline Pentacene Thin-Film Transistors,* Applied Physics Letters, vol. 82, pp. 3907–3909 (2003), which is hereby incorporated herein by reference in its entirety. The gate dielectric layer 115 is smooth, continuous, and is within the desired range of thickness, over a length of the insulating fiber sufficient for fabrication of a given fiber transistor 100. Portions of an extended length of insulating fiber 105 provided with a gate dielectric layer 115 that satisfy these parameters may be identified within the extended insulating fiber 105 and separately subjected to further process steps to form individual transistors or groups of transistors. For example, the smoothness, continuity and thickness of the gate dielectric layer 115 may be examined with a suitable optical inspection apparatus. Portions of an extended length of insulating fiber 105 provided with a gate dielectric layer 115 not meeting the foregoing desirable parameters can be excised and discarded.

The structure of the insulating fiber 105 has a relatively small diameter. Such structures exhibit high surface tension, which increases as the fiber diameter decreases. Hence, application of a gate dielectric layer 115 onto desired portions of the gate electrode 110 on the insulating fiber 105 without de-wetting of the surface of the gate electrode presents a technical challenge. Providing a relatively thick gate dielectric layer 115 would ameliorate the surface tension problem. However, the capacitance of the fiber transistor 100 is inversely proportional to the thickness of the gate dielectric layer 115. Hence, the gate dielectric layer 115 desirably is as thin as possible. The gate dielectric layer 115 disclosed herein resolves the surface tension problem while resulting in a fiber transistor 100 with acceptable capacitance.

In another embodiment, the gate dielectric layer 115 has a thickness of less than about 20μ. In a further embodiment, the gate dielectric layer 115 has a thickness of less than about 10μ. In an additional embodiment, the gate dielectric layer 115 has a thickness of less than about 1μ. In another embodiment, the gate dielectric layer 115 has a thickness of less than about 0.5μ. Preparation of gate dielectric layers having a thickness as low as about 0.2μ can potentially be done. However, if the gate dielectric layer 115 is too thin, pinholes communicating between the inner and outer surfaces of the layer may develop, leading to electrical shorts in the fiber transistor 100 and thus degrading its performance.

As the thickness of the gate dielectric layer 115 is decreased, the need for the polymer compositions selected for use herein increases, in order to enable formation of a substantially continuous coating in spite of the correspondingly increased surface tension forces. Uniformity of the thickness of the gate dielectric layer 115 throughout a given fiber transistor 100 is desirable due to the effect of such thickness on capacitance. However, thickness of the gate dielectric layer 115 may vary somewhat within a given fiber transistor 100, and among multiple fiber transistors 100.

The gate dielectric layer 115 is constituted by a polymer comprising carbon in the main polymer chain that is suitable for forming a smooth layer when applied by a coating process from solution. Chain entanglements and interactions in a given polymer, for example, promote the formation of a smooth polymer film from solution. Chain-chain interactions can include, for example, attractive forces between dipolar groups in mutually adjacent polymer chains, especially in the presence of aromatic species conjugated with the dipolar groups. In one embodiment, the polymer comprises dipolar moieties having a dipole moment of at least about 1 Debye. In another embodiment, the polymer comprises dipolar moieties having a dipole moment of at least about 1.5 Debyes. Other types of chain-chain interactions include, for example, hydrogen bonding. The polymer can include other elements in the main polymer chain, such as oxygen, for example. The main structure of some polymers may be better described as a matrix than as a chain. In such cases, such main matrix structure constitutes the main polymer chain for purposes of this discussion. Other polymers are characterized by a highly branched architecture, in some cases referred to as a "hyperbranched" or "dendritic" structure. In such cases, the branched structure constitutes the main polymer chain for purposes of this discussion. The polymer can potentially be mobilized in a liquid vehicle in a form other than a solution, for example in a suspension, provided that the polymer is so mobilized in a manner that emulates a solution. The term "solution" as used herein encompasses such mobilizations of the polymer that so emulate a solution. For example, the polymer so mobilized needs to be uniformly dispersed and not aggregated, and the resulting film needs to have adequate cohesion with the gate electrode 110.

In one embodiment, polymers comprising monomers or other precursors having dipolar groups having a dipole moment of at least about 1 Debye, such as carbonyl and sulfonyl groups, are selected for use in making the gate dielectric layer 115. For example, polycarbonates, polyimides, poly (ethersulfones) and polyacrylates can be used. The dipolar sulfone groups in poly (ethersulfones), and the dipolar carbonyl groups in polycarbonates, polyimides and polyacrylates, provide opportunities for strong chain-chain interactions among dipolar moieties in adjacent polymer regions, adding stability to the polymer.

The foregoing classes of polymers can if desired include hetero-group substituents so long as such substituents do not lead to substantial doping or quenching of the subsequently-applied semiconductor layer 120. For example, the following hetero-groups generally are acceptable: ethers, esters, ketones, amides, ureas, urethanes, alcohols, sulfides, sulfones, sulfonamides, phosphate esters, halogens, lower alkyl groups, and phosphonate esters. Poly (ethersulfones) comprising moieties including some non-aromatic functionalities, such as the dimethylmethylene groups of bisphenol-A for example, can be used. Introduction of such non-aromatic functionalities into an otherwise relatively rigid polymer such as a poly (ethersulfone) may be desirable to impart adequate flexibility to the resulting gate dielectric layer 115. Crosslinkable moieties can further be included in the polymer. However, excessive chain-chain interactions in a polymer can yield an insoluble gel, making deposition of a coating layer problematic. Amine and thiol groups desirably are avoided. Amines for example quench pentacene, a commonly used organic semiconductor. Conjugated moieties that are themselves electron donors or acceptors, such as quinones and anilines for example, desirably are also avoided because they too can quench or dope semiconductors. Suitable polyacrylates include poly (methyl methacrylate), poly (ethyl methacrylate), poly (benzyl methacrylate) and poly (phenyl methacrylate).

Polymers that were found to be ineffective in forming smooth films included poly (vinylacetate) and polystyrene. As to poly (vinylacetate), however, the polymer sample used had a low molecular weight of only 12,800 grams per mole. In comparison, a sample of poly (methylmethacrylate) that was employed had a viscosity average molecular weight of approximately 120,000 Mv. It is postulated that polymers having a substantial average molecular weight and meeting the other desirable polymer features discussed above may desirably be employed.

The semiconductor layer 120 may be constituted by any semiconductor composition that can form a structurally stable film on the gate dielectric layer 115 and withstand moderate bending. For example, an organic semiconductor, amorphous silicon, nanotubes and nanowires can be used. Inorganic semiconductors aside from amorphous silicon, nanotubes and nanowires generally cannot tolerate such bending and hence cannot be used unless bending is prevented in fabrication and use of the fiber transistor 100. However, a very thin layer of an inorganic semiconductor may be sufficiently flexible to be used. The organic semiconductor may be monomeric, oligomeric, or polymeric. In one embodiment, the semiconductor is an acene such as pentacene, for example. In further embodiments, a bithiophene such as 5,5'-bis-(4-hexylphenyl)2,2'-bithiophene or 5,5'-bis-(8-hexylfluorine-1-yl)2,2'-bithiophene is employed as the semiconductor. In additional embodiments, a thiophene such as sexithiophene or a benzothiophene dimer is employed as the semiconductor. Further exemplary thiophene compounds that can be used include: 2,5-linked thiophene tetramers, pentamers, and hexamers, either unsubstituted or substituted at the terminal 5 positions with linear alkyl or alkoxyalkyl chains of about 4 to about 12 atoms in length; anthradithiophene and terminal dialkyl derivatives thereof, including for example dihexylanthradithiophene; regioregular poly (3-hexylthiophene); and co-oligomers of 2,5-linked thiophene rings and 1,4-linked benzene rings about 5 rings long, either unsubstituted or substituted as described for the thiophene oligomers, including for example 1,4-bis(5-(5-hexylthien-2-yl)thien-2-yl)benzene ("DHT4Ph"). DHT4Ph can be synthesized according to well-known procedures. Exemplary procedures are described for preparing hexylated 5- and 6-ring compounds in W. Li et al, Chem. Mater., Vol. 11, page 458 (1999) (Herein, "Li article"), using 1,4-diiodobenzene as the source of the benzene ring. Other substituted and unsubstituted acenes such as anthracene, pentacene and hexacene for example, other bithiophenes, other thiophenes, phthalocyanines including for example copper phthalocyanine and perfluorinated copper phthalocyanine, naphthalene-1,4,5,8-tetracarboxylic diimide compounds, naphthalene-1,4,5,8-tetracarboxylic dianhydride, and 11,11,12,12-tetracyanonaphtho-2,6-quinodimethane, for example, can also be used. See, for example, Dimitrakopoulos et al. U.S. Pat. No. 5,981,970, Bauntech, et al. U.S. Pat. No. 5,625,199, Garnier et al. U.S. Pat. No. 5,347,144, and Klauck, Hagen et al., "*Deposition: Pentacene organic thin-film transistors and ICs,*" Solid State Technology, Vol. 43, Issue 3, March 2, pp. 63–75. The entirety of the foregoing patents and Li article cited in this paragraph are hereby incorporated herein by reference in their entirety. Other organic semiconductor compounds that are capable of transporting charge carriers when formed into a film can also be used.

In one embodiment, the semiconductor layer 120 desirably has an average thickness in a range between about 100 Å and about 1μ. In another embodiment, the semiconductor layer 120 desirably has an average thickness in a range between about 200 Å and about 0.2μ. In a further embodiment, the semiconductor layer 120 desirably has an average thickness in a range between about 250 Å and about 0.1 μ.

The source electrodes 125 and 126 and the drain electrodes 129 and 130 can be constituted by any electrically conductive material suitable for application in discrete areas on the surface of the semiconductor layer 120. In this exemplary embodiment, the source electrodes 125 and 126 and the drain electrodes 129 and 130 are placed only on one side of the circumference of the semiconductor layer 120, as discussed earlier. An electrically conductive paint composition comprising carbon or graphite can for example be used to form the source electrodes 125 and 126 and the drain electrodes 129 and 130. Alternatively, a metal or metal alloy that will not quench or otherwise react with the semiconductor layer 120 or undertake substantial migration in the fiber transistor 100 can be used. Suitable metals for this purpose include gold, silver, palladium, platinum, nickel and alloys. Aluminum may also be used provided that formation of an insulating aluminum oxide barrier layer is prevented. The source electrodes 125 and 126 and the drain electrodes 129 and 130 are desirably continuous in the regions where they are intended to direct electrons into and out of designated channel regions of the semiconductor layer 120. However, the source electrodes 125 and 126 and the drain electrodes 129 and 130 do not need to have smooth surfaces, do not need to have uniform thicknesses, and do not need to be particularly thin.

The thicknesses of the source electrodes 125 and 126 and the drain electrodes 129 and 130 can be selected as desired depending for example on the end use application for the fiber transistor 100. For example, if the insulating fiber 105 is a textile fiber, the source electrodes 125 and 126 and the drain electrodes 129 and 130 may be designed to be sufficiently thick so as to contribute tensile strength to improve the resistance of the fiber transistor 100 to degradation during use. In one embodiment, the source electrodes 125 and 126 and the drain electrodes 129 and 130 desirably have average thicknesses within a range of between about 300 Å and about 0.5µ. In another embodiment, the source electrodes 125 and 126 and the drain electrodes 129 and 130 desirably have average thicknesses within a range of between about 500 Å and about 0.2 µ.

In another embodiment, the order of placement of the various material layers on the insulating substrate 105 is inverted from the arrangements shown in FIG. 1. In this embodiment, the semiconductor layer 120, the source electrodes 125 and 126, and the drain electrodes 129 and 130 are formed on the insulating substrate 105. In one aspect of this embodiment, the semiconductor layer 120 is formed, and then the source and drain electrodes are formed. In another aspect of this embodiment, the source and drain electrodes are formed, and then the semiconductor layer 120 is formed. Further in this embodiment, the gate dielectric layer 115 then is formed. The gate electrode 110 is then formed on the gate dielectric layer 115. Via holes are made to access the source electrodes 125 and 126, and the drain electrodes 129 and 130 in the fiber transistor 100.

In order to place the fiber transistor 100 into use, the gate electrode 110, source electrodes 125 and 126 and drain electrodes 129 and 130 are suitably connected into an external circuit, not shown. Charge carriers then migrate through the semiconductor layer 120 in regions between the source electrodes 125 and 126 and drain electrodes 129 and 130, as controlled or modulated by a voltage applied to the gate electrode 110.

FIG. 2 shows a process 200 for making the fiber transistor 100 discussed above. In step 205, an insulating fiber 105 is provided. The insulating fiber 105 can have any desired length, and the length can be selected either for production of a single fiber transistor 100, for production of a plurality of fiber transistors 100 in a batch, or for continuous production of multiple fiber transistors 100.

In step 210 the insulating fiber 105 is suitably immobilized to facilitate application of the gate electrode 110. Since the source electrodes 125 and 126 and drain electrodes 129 and 130 in this exemplary embodiment are placed only on one side of the circumference of the semiconductor layer 120, the application of the gate electrode 110 can also be similarly localized. Hence in this case, the insulating fiber 105 can be immobilized for further processing by simply attaching the insulating fiber 105 to a substrate such as a glass micro-slide by an interposed sheet of double sided adhesive tape. Alternatively, the insulating fiber 105 can be immobilized by attaching one end of the insulating fiber 105 to a substrate such as a micro-slide, leaving the remainder to hang freely. In embodiments where application of the gate electrode 110 to both sides of the insulating fiber 105 is desired, the insulating fiber 105 can also be immobilized at both ends, for example by affixing each end to a micro-slide or sandwiched between two micro-slides. The micro-slides can then be placed in a spaced apart arrangement as desired, thus positioning the interposed insulating fiber 105 as needed. In a continuous process, the portion of the insulating fiber 105 to which the gate electrode 110 is being applied can be immobilized between spaced apart pairs of rollers or the like.

In step 215 the gate electrode 110 is provided on the insulating fiber 105. Suitable techniques for applying the gate electrode 110 include, for example, solution and vapor deposition. Solution deposition involves applying a conductive material onto the insulating fiber 105 from a solution, and can be carried out, for example, by electroless plating of a metal. Metals and ceramics can also be sputtered.

In one embodiment, gold is selected as the material to constitute the gate electrode 110, and is applied by vapor deposition. For example, the insulating fiber 105 can be placed inside a vacuum evaporator together with a source of gold, and means to heat the gold to its vaporization temperature. The evaporator may desirably be evacuated prior to the evaporation, to a pressure of, for example, $5 \times 10^{-6}$ Torr. The entire surface of the insulating fiber 105 that is intended to form the fiber transistor 100 can if desired be provided with the gate electrode 110. In cases where the insulating fiber 105 is an optical fiber, the fiber lumen can later be exposed to permit light propagation by simply cutting both ends of the completed fiber transistor 100. In one embodiment, the insulating fiber 105 is secured in a vertical position within the evaporator with the free end or exposed side facing down. A source of gold is placed below the insulating fiber 105 and the gold is vaporized. The gold vapor is directed upward and onto the insulating fiber 105. If both sides of the insulating fiber 105 are to be covered by the gate electrode 110, then one side of the insulating fiber 105 can be positioned in the evaporator so as to face toward the source of gold. After vaporization of gold onto the one side, the insulating fiber 105 can then be repositioned to vaporize gold onto the other side.

In another embodiment, two sources of gold are both placed below and laterally away from the insulating fiber 105, and the gold is vaporized. In this case the gold vapor is directed laterally upward, such that the two gold sources potentially can facilitate a more evenly focused coating on the surface of the insulating fiber 105. In an additional embodiment, the insulating fiber 105 is horizontally suspended between two supporting substrates with a middle section of the insulating fiber 105 exposed. One source of gold is then placed below the insulating fiber 105 facing upward, and the other source is placed above the insulating fiber 105 facing downward, with the gold suitably secured from falling out. In this case the gold vapor is directed both upward and downward onto the insulating fiber 105. In still another embodiment, the insulating fiber 105 is vertically suspended by a rotatable arm that then swings the insulating fiber 105 in a circular pendulum motion over one or more sources of gold vapor placed below. In this case the motion of the insulating fiber relative to one or more stationary sources of gold vapor may facilitate an evenly focused coating on the surface of the insulating fiber 105. In one exemplary embodiment, gold is evaporated onto the insulating fiber 105 at a rate of 1 Å/second for 500 seconds, yielding an average gate electrode layer thickness of about 500 Å.

In one embodiment, the capability of a polymer solution for making the gate dielectric layer to subsequently be spread over the surface of the gate electrode 110 is enhanced by a post-treatment of the gate electrode 110 such as, for example, polishing or functionalizing the surface of the gate electrode 110. Polishing can be carried out by immersion of the gate electrode 110 on the insulating fiber 105 in an agitated suspension of a finely divided abrasive powder in a fluid, or by mechanical rubbing of the gate electrode 110 with a suitable abrasive material. Functionalization of a gate electrode 110 comprising gold, for example, can be carried out by thiolating the gold surface of the gate electrode 110 with an organic thiol compound containing a high surface energy end group. Further, a surface of a gate electrode 110 comprising platinum, for example, can be functionalized with an organic isocyanide compound containing a high surface energy end group. Additionally, a surface of a gate electrode 110 comprising aluminum, for example, can be functionalized with an organic phosphoric or carboxylic acid containing a high surface energy end group.

In step 220, interconnects for the gate electrode 110 are provided so that the completed fiber transistor 100, as discussed above, can later be connected into an external circuit for operating the transistor. In one embodiment, at least one selected portion of the surface of the gate electrode 110 is temporarily protected from deposition thereon of further layers of the fiber transistor 100. In this manner, the protection can later be removed to facilitate the interconnection. For example, about one-quarter of an inch of one end of the gate electrode 110 may be provided with a protective cover. One-sided adhesive tape, for example, can be used to constitute the protective cover. In another embodiment, no such protection is provided, and instead following completion of preparation of the fiber transistor 100, a desired portion of the gate electrode 110 is exposed for interconnection. This exposure may be carried out, for example, by etching, scraping, or puncturing.

In step 225, the gate dielectric layer 115 is provided. In order to apply a polymer selected as discussed above onto the gate electrode 110, the polymer is dissolved in a suitable solvent. The solvent is chosen to be highly compatible with the polymer. For example, the solvent should readily solvate the polymer, and the solvent desirably has a polarity that is closely matched with that of the polymer. Suitable solvents meeting these desired parameters for the polymers discussed above are well known.

In one embodiment, the gate dielectric layer 115 is prepared by a dip coating process. The invention will be further discussed in connection with an exemplary dip coating process. However, other processes that bring the surface of the gate electrode 110 into proximity with a supply of a polymer solution and then leave behind a thin, smooth and substantially continuous polymer coating on the gate electrode 110 can be used. Furthermore, other processes that are suitable for forming a thin, smooth, substantially continuous polymer coating layer on an insulating fiber as defined herein can be used. By "dip coating" is broadly meant that a motion of the insulating fiber 105 as previously provided with the gate electrode 110, relative to a supply of the selected polymer solution, results in deposition of a coating of the polymer solution on the gate electrode 110. Alternative techniques that are not preferred include spin coating and film casting.

In carrying out a dip coating process, three important parameters to be managed include the polymer solution viscosity, the dip coating rate, and the solvent vapor pressure. A fundamental objective in this step 225 is to provide a thin, smooth and substantially continuous coating of the polymer solution on the gate electrode 110, in order to yield the desired gate dielectric layer 115. In carrying out a dipping process, the polymer solution viscosity needs to be adequately high to facilitate preparation of a substantially continuous polymer coating, and adequately low to facilitate preparation of a thin coating. If the viscosity is too low, the polymer may de-wet the surface of the gate electrode 110 and form a discontinuous coating layer. If the viscosity is too high, excessive polymer may adhere to the gate electrode 110 as further aggravated by evaporation of the solvent, leading to an excessively thick polymer coating layer. Other polymer properties that are related to viscosity and which can be modulated to control the polymer solution viscosity include the molecular weight of the polymer, the concentration of the polymer in the solvent, and the strength of chain-chain interactions of dipolar groups in adjacent polymer chains in the solution.

The dip coating rate is defined as the rate at which the surface of the gate electrode 110 and a supply of the polymer solution are separated from each other during the dip coating process. For example, the gate electrode 110 may be dipped into a vial of polymer solution and then pulled out of the solution, leaving a coating of polymer solution on the gate electrode 110. This pulling action creates capillary adhesion forces on the surface of the gate electrode 110, causing the polymer solution to adhere to the surface. In other words, the liquid polymer solution is attracted to the surface of the gate electrode and rises up the surface to a macroscopic degree, so that pulling up the gate electrode 110 out of a supply of the polymer solution causes the polymer solution to be pulled up with the gate electrode 110. These capillary forces may become gradually stronger as a gate electrode 110 is progressively pulled out of a supply of polymer solution, caused for example by the constant evaporation of the solvent from the polymer. If the polymer solution comprises a relatively low concentration of polymer, then the pulling action desirably is undertaken at a relatively high speed, so that adequate polymer is pulled up onto the gate electrode 110. If the polymer solution comprises a relatively high concentration of polymer, then the pulling action desirably is undertaken at a relatively low speed, to avoid pulling up excessive polymer onto the gate electrode 110, and to allow some of the polymer so pulled up to flow back down into the vial. However, if the pulling action in this case is carried out too slowly, the rate of solvent evaporation may become a dominant factor, leaving excessive polymer on the gate electrode 110. Very fast pulling action can create bubbles in the polymer on the gate electrode 110, which are also desirably avoided.

The solvent vapor pressure is indicative of the rate at which the solvent evaporates from the polymer. As the gate electrode 110 is pulled away from the supply of polymer solution, solvent is continuously evaporating from the surface of the polymer supply and from the polymer solution that has been pulled up onto the portion of the gate electrode 110 already removed from the polymer supply. If the rate of such evaporation is too high, excessive polymer may adhere to the gate electrode 110 due to the rapid loss of solvent, thus becoming fixed in position and failing to flow back into the polymer supply. In addition, the drying action resulting from the solvent evaporation provides further capillary force, pulling additional polymer solution upward and onto the emerging portion of the gate electrode 110. Thus, a gate dielectric layer 115 having an excessive thickness will result. If, on the other hand, the solvent vapor pressure is too low, excessive polymer may flow off of the gate electrode 110, leaving behind a gate dielectric layer 115 that is discontinuous or has pinholes. In one embodiment, step 225 is desirably carried out in a closed chamber having a controlled solvent vapor pressure to minimize the adverse effects of undesirably rapid, slow, or irregular solvent evaporation on the polymer coating thickness.

Ambient humidity in the environment where the polymer solution is coated onto the gate electrode desirably is also controlled. In one embodiment, the relative humidity is controlled to be less than about 70%. Relative humidity is the actual water vapor pressure in a given parcel of air divided by the saturation water vapor pressure, at a given ambient temperature. In another embodiment, the relative humidity is controlled to be less than about 50%. As the level of relative humidity is thus reduced, incidence of discontinuities in the gate dielectric layer 115 due to absorption by the polymer of water is also reduced.

In one embodiment where the polymer for forming the gate dielectric layer is a polycarbonate, polyimide or polyacrylate, a suitable solvent is cyclopentanone. In another embodiment where the polymer for forming the gate dielectric layer is a poly (ethersulfone), a suitable solvent is N,N-dimethylformamide.

In general, the dip coating process of step 225 is carried out by passing the gate electrode 110 into and out of a vessel containing the polymer solution. The vessel can for example be open at the top so that the gate electrode 110 is conveyed upwardly out of the polymer solution. Alternatively for example, the vessel can be a cup with a hole in the bottom adapted for passage of the insulating fiber 105 without undesired escape of the polymer solution, and the gate electrode can be passed upward or downward through the polymer solution. In another embodiment, the vessel can be open at the top to provide a pool of polymer solution, and the gate electrode can be passed laterally or horizontally into and out of the pool of polymer solution.

In one embodiment, the gate electrode 110 is suspended over a vessel of polymer solution. The vessel of polymer solution may then be raised up to and then pulled down away from the gate electrode 110. The pulling down can be carried out either in a continuous motion, or stepwise with interposed stops and starts. The stops allow polymer solution to flow back down into the vessel, and the starts create capillary forces pulling the polymer solution up onto the gate electrode 110. In another embodiment, the gate electrode 110 may be lowered into and then pulled up and out of the polymer solution in the vessel. In one embodiment, the gate electrode 110 has a length of between about 2 cm and about 4 cm. The pulling down may then, for example be carried out with four stops each lasting 10 seconds.

Desirably, the length of movement of the polymer solution relative to the longitudinal axis of the gate electrode 110 is uniform between the stops, in furtherance of thickness uniformity in the deposited polymer. Furthermore, desirably the pulling down is done at such a speed so that the polymer solution flowing down does not quite reach the interface between the pool of polymer solution and the atmosphere. In this manner, such polymer solution does not distort the capillary forces acting on the pool of polymer solution at the interface.

The dipping process can be manually carried out, but coating layer thinness and uniformity are difficult to achieve in such a manner, possibly resulting in fiber transistors 100 having little or no measurable charge carrier mobility. A semi-automatic process can also be carried out, in which a gate electrode 110 is suspended downward by an apparatus suitable for raising and lowering the gate electrode, such as an Ametek Accuforce III adhesion measurement apparatus commercially available from the Mansfield & Green Division of Ametek, Inc., 37 North Valley Road Building 4, P.O. Box 1764, Paoli, Pa. 19301 U.S.A. A vessel of polymer solution is then manually moved upward onto the gate electrode 110 using a mechanical platform capable of being vertically raised and lowered, such as a jack. The Ametek apparatus is then used to pull the gate electrode out of the pool of polymer solution in a controlled manner. The Ametek apparatus can also be used in a fully automatic process first to lower the gate electrode down into a stationary vessel of polymer solution and second to remove the gate electrode from the pool of polymer solution. Other apparatus suitably adapted to carry out these raising and lowering maneuvers can be substituted for the Ametek apparatus.

The maximum concentration of a given polymer that can be dissolved in a given solvent operates as an effective upper limit on the proportion of polymer used. The minimum concentration of a selected polymer that can be dip coated onto a gate electrode without de-wetting operates as an effective lower limit on the proportion of polymer used. In one embodiment where the polymer is a poly (ethersulfone) dissolved in N,N-dimethylformamide and the polymer solution is manually applied to the gate electrode 110, the poly (ethersulfone) constitutes between about 15% and about 25% by weight of the polymer solution. Where an automated dip coating process is used, the poly (ethersulfone) may constitute between about 10% and about 25% by weight of the polymer solution. Where the molecular weight of the poly (ethersulfone) is extremely high, its concentration in the polymer solution can potentially be as low as about 5% by weight using an automated dip coating process. In another embodiment where the polymer is a polycarbonate dissolved in cyclopentanone and an automated dip coating process is used, the polycarbonate constitutes between about 10% and about 20% by weight of the polymer solution. In a further embodiment where the polymer is poly (methylmethacrylate) dissolved in cyclopentanone and an automated dip coating process is used, the poly (methylmethacrylate) constitutes between about 8.3% and about 10% by weight of the polymer solution. In an additional embodiment where the polymer is a polyimide dissolved in cyclopentanone and an automated dip coating process is used, the polyimide constitutes between about 4% and about 8.3% by weight of the polymer solution.

Following application of the polymer solution to the gate electrode 110, the solvent is removed, yielding a solidified gate dielectric layer 115. In one embodiment, the polymer solution on the gate electrode 110 is baked at a temperature of about 175 degrees centigrade ("° C.") for about 15 hours. In another embodiment, the solvent is removed from the polymer coating simultaneously with pulling the gate electrode 110 out of the polymer solution. For example, a laser irradiation device can be focused on a point in the path of the gate electrode 110 as it is pulled out of the polymer solution, so that the polymer is dried at that point on a virtually instantaneous basis. This approach freezes the coating layer morphology and may help prevent de-wetting of the gate electrode 110 by solvated polymer where solvent evaporation proceeds too slowly. A stepwise withdrawal of the gate electrode 110 from the polymer solution may be desirable in order to provide adequate time for the laser to remove the solvent from a given portion of the gate dielectric layer 115. If crosslinkable moieties are present in the polymer, the laser can provide energy to accelerate the crosslinking.

In step 230, the insulating fiber 105 provided with the gate electrode 110 and the gate dielectric layer 115 is again immobilized in the same manner as discussed above in connection with step 210, so that the semiconductor layer 120 can be applied.

In step 235, the semiconductor layer 120 is provided on the gate dielectric layer 115. The semiconductor layer 120 can if desired cover substantially the entire gate dielectric layer 115, but desirably does not make electrical contact with the gate electrode 110 in order to prevent shorting. Alternatively, the semiconductor layer 120 can be selectively applied to cover only those areas of the surface of the gate dielectric layer 115 to be subsequently overlaid with source electrodes 125 and 126 and drain electrodes 129 and 130 in order to form channel regions under and between such source and drain electrodes. If, for example, only one side of the insulating fiber 105 will be provided with a fiber transistor 100, then that side can be selectively provided with semiconductor layer 120. Application of the semiconductor layer 120 can be carried out using conventional techniques, such as by vapor deposition using an evacuated evaporator, or dip coating.

In step 240, the insulating fiber 105 provided with gate electrode 110, gate dielectric layer 115 and semiconductor layer 120, is masked in preparation for applying the source electrodes 125 and 126 and the drain electrodes 129 and 130. Referring to FIG. 1, a mask can be prepared having slits defining the boundaries of the source electrodes 125 and 126 and drain electrodes 129 and 130. The mask is positioned over the insulating fiber 105 in the desired location and secured in place, for example by adhesive tape. In another embodiment, screen wire is used, for example having a mesh length and width of about 200μ or less.

In step 245, the source electrodes 125 and 126 and drain electrodes 129 and 130 are provided on the semiconductor layer 120. A variety of techniques can be employed to deposit the selected electrically conductive composition to constitute the source electrodes 125 and 126 and drain electrodes 129 and 130. For example, electrically conductive paint can be applied onto the semiconductor layer 120 through the mask. Inkjet printing, photolithography, electron beam lithography, micro-contact stamp printing, or dip pen lithography can also be used. See, for example, Piner, Richard D. et al., "'Dip-Pen' Nanolithography", *Science,* Vol. 283, pp. 661–663, January 1999, the entirety of which is hereby incorporated herein by reference. Further, a metal or metal alloy that will not quench the semiconductor layer 120 or undertake substantial migration within the fiber transistor 100 can be applied in the same manner as discussed above in connection with step 215. After making the source electrodes 125 and 126 and drain electrodes 129 and 130, the mask is removed and the fabrication of the fiber transistor 100 is complete.

In the foregoing discussion, the fiber transistor 100 comprises a sandwich of source electrodes 125 and 126 and drain electrodes 129 and 130 on semiconductor layer 120 on gate dielectric layer 115 on gate electrode 110 on insulating fiber 105. In further embodiments, the source electrodes 125 and 126 and drain electrodes 129 and 130 are applied onto the gate dielectric layer 115 before application of the semiconductor layer 120. Hence in this embodiment, the fiber transistor 100 shown in FIG. 1 is modified so that the source electrodes 125 and 126 and drain electrodes 129 and 130 are sandwiched between the gate dielectric layer 115 and the semiconductor layer 120. Further in this embodiment, the process for making the fiber transistor 100 shown in FIG. 2 is modified so that steps 240 and 245 for making the source electrodes 125 and 126 and drain electrodes 129 and 130 are completed before step 235 is carried out for making the semiconductor layer 120. Since the semiconductor layer 120 is thus applied over the source electrodes 125 and 126 and drain electrodes 129 and 130, suitable leads for interconnection of such electrodes into an external circuit are desirably formed integrally with the electrodes and protected from subsequent over-coating by the semiconductor layer 120.

FIG. 3 shows an additional embodiment of a fiber transistor 300. The fiber transistor 300 comprises an insulating fiber 305, a gate electrode 310, a gate dielectric layer 315, a semiconductor layer 320, two continuous spiral source electrodes 325 and 335, and two continuous spiral drain electrodes 330 and 340. The spiral source electrodes 325 and 335 are interleaved with the spiral drain electrodes 330 and 340 on the surface of the semiconductor layer 320, forming two interleaved spiral channel regions 345 and 350 within the semiconductor layer 320. The paired spiral source and drain electrodes desirably are wound in loops of a double helix that provides adequate distance between adjacent loops of the helix to reduce loop-to-loop leakage currents. Although the exemplary embodiment includes two spiral source electrodes 325 and 335, and two spiral drain electrodes 330 and 340, a particular device may be provided with only one spiral source electrode 325 and only one spiral drain electrode 330, or any desired larger numbers of spiral source electrodes and spiral drain electrodes. Desirably the spiral source electrodes and spiral drain electrodes are substantially equal in number and arranged in alternating fashion as matched pairs. FIG. 3 further shows that direct electrical connection between the gate electrode 310 and the semiconductor layer 320 is prevented by an interposed exposed region of the gate dielectric layer 315 extending beyond the edge 355 of the semiconductor layer 320.

The fiber transistor 300 can be prepared using the same materials and according to the same process shown in FIG. 2, and discussed above in connection with fiber transistor 100 shown in FIG. 1, with modifications to the manner in which steps 240 and 245 are carried out.

In transistor design, an important parameter is the W/L ratio, in which W means the end-to-end length of each source and drain electrode, and in which L means the path distance through the channel region of the semiconductor layer between the source and drain electrodes. A high W/L ratio is desirable as an indication that charge carriers travel through a relatively short distance between the source and drain electrodes, facilitating high potential current output. Another important parameter is the electrode surface area as a proportion of the semiconductor surface area. A small proportional electrode surface area is desirable as corresponding to a high density of channel regions in the semiconductor layer, also facilitating high potential current output. The spiral design shown in FIG. 3 desirably provides a relatively high W/L ratio and a relatively low proportional electrode surface area as compared with the fiber transistor design shown in FIG. 1. The uniform coverage of the surface of the semiconductor layer 320 by the spiral electrodes contributes to these desirable results. Since the spiral design facilitates the making of continuous source and drain electrodes on the semiconductor layer, a single transistor of any desirable length generally can be made. A long fiber transistor having spiral source and drain electrodes can potentially carry a very high current. Desirably, the semiconductor layer 320 is selectively placed only on the regions of the gate dielectric layer 315 where formation of channel regions is intended, underlying the gaps to be spanned by charge carriers between the paired spiral source and drain electrodes.

Referring back to FIG. 2, screens with a relatively small mesh are desirably used as masks in step 240 for preparation of the fiber transistor 100 of FIG. 1 as relatively high W/L ratios will generally result. Masks creating stripes, such as a wire fixed in a serpentine manner defining a series of parallel slits, can also be used to make the fiber transistor 100 of FIG. 1.

In step 240, the semiconductor layer 320 of the fiber transistor 300 is masked in preparation for making the spiral source electrodes 325 and 335, and the spiral drain electrodes 330 and 340. This masking step can be carried out by spirally winding two spaced apart wires simultaneously onto the semiconductor layer 320. The wire to be used can be, for example, tungsten wire having a diameter within a range of between about 6μ and about 20μ. The portions of the semiconductor layer 320 thus covered by the wires will then become the gaps between the electrodes and form the semiconductor channel regions, when the wires are removed following provision of the spiral source electrodes 325 and 335, and the spiral drain electrodes 330 and 340. In order to so wind the two wires, a spiral winding machine of the type used to wind rope, cords or trimming tapes can be used. The machine is adapted to position two or more spools of wire around the semiconductor layer 320 of the fiber transistor 300, and to then apply the wires onto the semiconductor layer 320 while constantly traversing the longitudinal axis and orbiting around the circumference of the fiber transistor 300. The spools can be so positioned by being mounted on spindles attached to a revolving plate. As the plate revolves, the spindles twist around the fiber transistor 300, in a direction opposite to the direction of motion of the plate. Hence, a twist is imparted to the wires that enables the resulting masked fiber transistor 300 to remain wound and retain its shape. The ends of the spiral wires are then secured to the semiconductor layer 320. A buffer region between the ends of the semiconductor layer and the wires is then masked so that the source and drain electrodes to be made in step 245 will not make electrical contact with the gate electrode 310. In another embodiment, high strength filaments composed of any feasible metallic, non-metallic or mixed metallic and non-metallic elements can also be used in the same manner, such as, for example, graphite fibers.

In step 245, the spiral source electrodes 325 and 335 and the spiral drain electrodes 330 and 340 are made using the same techniques as discussed above in connection with FIG. 2. The wires used to mask the semiconductor layer 320 are then removed.

FIG. 4 shows an exemplary fiber transistor 400. The fiber transistor 400 comprises an insulating fiber 405, a gate electrode 410, a gate dielectric layer 415, a semiconductor layer 420, source electrodes 425 and 426, and drain electrodes 429 and 430. Each of such electrodes 425, 426, 429 and 430 is in the shape of an elongated rectangle and is positioned with its longitudinal axis parallel to the longitudinal axis of the insulating fiber 405 on the surface of the semiconductor layer 420. The source electrodes 425 and 426 are also interleaved with the drain electrodes 429 and 430 on the surface of the semiconductor layer 420, forming two spaced apart channel regions 440 and 445 within the semiconductor layer 420. In this exemplary embodiment, the source electrodes 425 and 426, and the drain electrodes 429 and 430 are placed only on one side of the circumference of the insulating fiber 405. Although the exemplary embodiment includes two source electrodes 425 and 426 and two drain electrodes 429 and 430, a particular device may be provided with only one source electrode 425 and only one drain electrode 429, or any desired larger numbers of source electrodes and drain electrodes. Desirably the source electrodes and drain electrodes are substantially equal in number and arranged in alternating fashion as matched pairs. FIG. 4 further shows that direct electrical connection between the gate electrode 410 and the semiconductor layer 420 is prevented by an interposed exposed region of the gate dielectric layer 415 extending beyond the edge 450 of the semiconductor layer 420. The fiber transistor 400 can be made in the same manner as discussed above in connection with FIG. 2, except that a mask is prepared having slits defining the boundaries of the source electrodes 425 and 426 and drain electrodes 429 and 430.

The fiber transistors made as discussed above having a gate dielectric layer comprising a poly (ethersulfone) are desirably characterized by on/off ratios of between about 10 and about 6232, although devices having higher and lower on/off ratios can also be made. These fiber transistors are desirably characterized by a mobility between about 0.01 squared centimeters per volt-second ("$cm^2/Vs$") and about 0.14 $cm^2/Vs$. The fiber transistors made as discussed above having a gate dielectric layer comprising a polyimide are desirably characterized by on/off ratios of between about 17 and about 2154, although devices having lower on/off ratios can also be made. These fiber transistors are desirably characterized by a mobility between about 0.01 $cm^2/Vs$ and about 0.51 $cm^2/Vs$. The fiber transistors made as discussed above having a gate dielectric layer comprising a polyacrylate are desirably characterized by on/off ratios of between about 13 and about 2234, although devices having lower on/off ratios can also be made. These fiber transistors are desirably characterized by a mobility between about 0.01 $cm^2/Vs$ and about 0.11 $cm^2/Vs$. The fiber transistors made as discussed above having a gate dielectric layer comprising a polycarbonate are desirably characterized by on/off ratios of between about 254 and about 6830, although devices having lower on/off ratios can also be made. These fiber transistors are desirably characterized by a mobility between about 0.01 $cm^2/Vs$ and about 0.28 $cm^2/Vs$.

Collectively, the fiber transistors made as described above are desirably further characterized by a maximum on-current of at least about 100 nano amps, desirably at least about 500 nano amps, more desirably at least about 1 micro amp. Collectively, the fiber transistors are desirably characterized by a mobility between about 0.01 $cm^2/Vs$ and at least about 0.51 $cm^2/Vs$. Collectively, the fiber transistors are desirably characterized by on/off ratios of between about 10 and at least about 6830. Collectively, the fiber transistors are further desirably characterized by on/off ratios of at least about 100. Desirably, the fiber transistors exhibit saturation behavior.

The fiber transistors have a wide range of potential end-use applications. For example, where the insulating fiber is an optical fiber, the fiber transistors can be used in circuits for regulating an optical fiber, such as optical switches to turn the propagation of light in the optical fiber on and off. Where the insulating fiber is a textile fiber, the fiber transistors can be integrated into fabrics, cords, and other textile materials. A fabric comprising the fiber transistors can be formed into an article of clothing. Such a fabric or article of clothing can be integrated into electronic devices such as visual displays, actuators, and sensors for example of temperature, light, pressure, or chemicals.

The preceding discussion has addressed embodiments specifically for making fiber transistors. However, more generally in further embodiments, fibers are made having a diameter of less than about 5 mm and which are coated with a dielectric polymeric layer that is smooth, thin and continuous.

Figure 5:
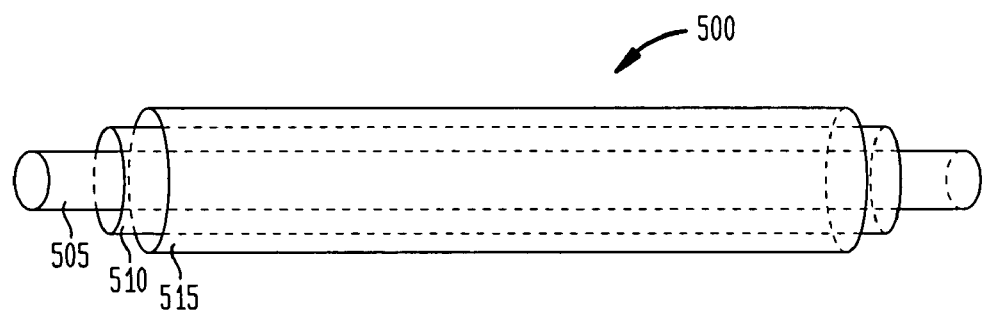
FIG. 5 shows a perspective view of a coated fiber according to the present invention.

FIG. 5 shows an exemplary coated fiber 500. The coated fiber 500 comprises a fiber 505 having an electrically conductive outer surface 510, and a dielectric layer 515.

The fiber 505 can be any monofilamentary or multifilamentary material suitable to act as a supporting substrate for the dielectric layer 515, and having a sufficiently smooth surface to enable the application of a substantially continuous coating of a dielectric polymer. Multifilamentary materials can be used as the fiber 505 provided that they present surfaces that are sufficiently smooth, orderly and continuous to facilitate application of a substantially continuous coating of a dielectric polymer. For example, multiple monofilaments can be juxtaposed together in a mutually parallel manner, a helical manner, or a braided manner. Broadly, the fiber 505 has a diameter d of less than about 5 mm. In another embodiment, the fiber 505 has a diameter d of less than about 2 mm. In a further embodiment, the fiber 505 has a diameter d of less than about 1 mm. Within the foregoing diameter limits for the fiber 505, high surface tension exists on the tubular circumference of the fiber 505 due to its small, curved structure. The present invention facilitates the provision of a continuous coating on such an fiber 505 as described herein, in spite of this high surface tension. The fiber 505 can be constituted, for example, by an optical, metal or textile fiber. Where the fiber 505 does not itself have an electrically conductive outer surface, such as an optical or textile fiber, then an electrically conductive outer surface 510 is interposed between the fiber 505 and the dielectric layer 515. The electrically conductive outer surface 510 is constituted by a layer on the fiber 505 of a material suitable for conducting electrons. The electrically conductive outer surface 510 can, for example, be constituted by a conductive polymer, metal or ceramic. The thickness of the electrically conductive outer surface 510 on the fiber 505 can be selected in the same manner as discussed earlier with respect to the thickness of the gate electrode 110 of FIG. 1.

Figure 6:
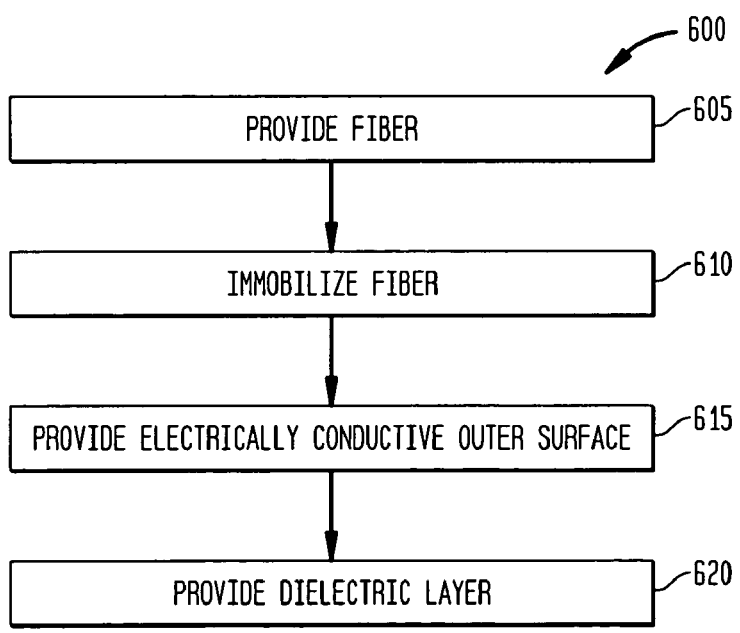
FIG. 6 shows a process for making the coated fiber of FIG. 5.

FIG. 6 shows a process 600 for making the coated fiber 500. In step 605, a suitable fiber 505 is provided in the same manner as in step 205 discussed above in connection with FIG. 2. In step 610, the fiber 505 is immobilized for further processing in the same manner as in step 210 discussed above. If the fiber 505 does not itself have an electrically conductive outer surface, then in step 615 an electrically conductive outer surface is provided on the fiber 505 in the same manner as discussed above in connection with step 215 for preparation of the gate electrode 110. In step 620, the dielectric layer 515 is provided on the fiber 505 in the same manner as discussed above in connection with step 225.

The dielectric layer 515 has a thickness of less than about 50μ, has a smooth outer surface, and is substantially continuous, the terms "smooth" and "substantially continuous" having the same meanings as defined earlier. In another embodiment, the dielectric layer 515 has a thickness of less than about 20μ. In a further embodiment, the dielectric layer 515 has a thickness of less than about 10μ. In an additional embodiment, the dielectric layer 515 has a thickness of less than about 1μ. In another embodiment, the dielectric layer 515 has a thickness of less than about 0.5μ. Preparation of dielectric layers having a thickness as low as about 0.2μ can potentially be done. As the thickness of the dielectric layer 515 is decreased, the need increases for the polymer compositions disclosed herein in order to enable formation of a substantially continuous coating in spite of the correspondingly increased surface tension forces. Portions of an extended length of fiber 505 provided with a dielectric layer 515 not meeting the foregoing desirable parameters can be excised and discarded. The dielectric layer can be made from the same materials as discussed earlier in connection with the gate dielectric layer 115 of FIG. 1, and using the same techniques as discussed earlier in connection with step 225 of FIG. 2. The coated fibers 500 discussed above are characterized by the dimensions of the fiber 505, electrically conductive outer surface 510 and dielectric layer 515, and by the smooth and substantially continuous nature of the dielectric layer 515.

The coated fibers 500 have a wide range of potential uses. For example, the coated fibers 500 can be incorporated into capacitors used to regulate circuit time constants and to stabilize transistor voltages.

EXAMPLE 1

Poly (Ethersulfone)

A series of fiber transistors was made, each including a poly (ethersulfone) gate dielectric layer, by a series of steps as now described. Standard OFS Fitel optical fibers identified as CC #10770935, 100 m of MP980, Lot #06801 were cut to lengths of between about 2 cm and about 4 cm. Glass micro-slides from Corning Incorporated were cut to lengths and widths within ranges of between about 1 cm and about 5 cm. Double-sided adhesive tape was attached to the top surface of each micro-slide, and one to three of the optical fibers were attached to the double-sided adhesive tape in a spaced apart manner to immobilize them, on each micro-slide.

Each micro-slide was then separately placed in a vacuum evaporator having a source of gold at the bottom, below a point where the micro-slides were suspended in the evaporator. The pressure within the evaporator was reduced to $5\times10^{-6}$ Torr, and gold was heated and evaporated onto the exposed surfaces of the optical fibers on the micro-slides at a rate of about 1 Å/second for about 500 seconds, yielding gold gate electrodes having a nominal thickness of about 500 Å.

In order to provide the gate dielectric layers on the gate electrodes, a solution of poly (ethersulfone) grade RADEL A, obtained from Solvay S. A. ("PES") was dissolved in N,N-dimethylformamide. Measured amounts of 4 grams ("g") PES and 12 g of N,N-dimethylformamide were generally used, constituting 25% PES by weight. However, in certain trials, 20% PES by weight was used. The PES appeared to completely dissolve after stirring for a few hours at room temperature and after additional heating to a temperature of 100° C., forming a PES solution. A portion of the PES solution was then put in a vial so that the height of the pool of liquid in the vial was at least about 3 cm, to allow for dipping of the gate electrodes to form the gate dielectric layer.

Manual, semi-automatic and automatic dip-coatings of PES solution were then carried out on separate portions of the fibers having gate electrodes. In order to carry out manual dip coatings, optical fibers having previously applied gate electrodes were individually removed from the double-sided tape on micro-slides and suspended in fixed positions, oriented downwards. The vial containing the PES solution was placed on a laboratory jack successively positioned underneath each of the fixed fibers. The gate electrodes on each of the optical fibers were then separately dip coated with the PES solution by raising the jack to move the vial up towards each fiber and then down and away from the fiber. The jack was moved both upward and downward at a controlled rate, so that during each of the processes of immersing the fiber in the PES solution and of removing the pool of PES solution from the fiber, the movement of the jack was stopped for approximately 10 seconds at each of six evenly spaced times. Hence, the upward and downward processes included a total of twelve such stops.

In order to carry out the semi-automatic process, the laboratory jack was used in the manner described above for the process of immersing the gate electrodes in the pool of PES solution. However, the optical fibers were suspended by either a syringe pump or an Ametek adhesion measurement apparatus, both such devices being chosen for their capability to raise and lower the optical fibers in a controlled manner. The process of separating the immersed gate electrodes from the pool of PES solution was then carried out by using the syringe pump or Ametek apparatus to pull the gate electrodes up, again with 6 stops each having a duration of about 10 seconds until the gate electrodes were clear of the surface of the PES pool. In using the syringe pump, the pump flow rate was optimally set to yield vertical motion of about 11μ/second, at a pump setting of 500×⅒. The apparatus, normally used to move the plunger of a syringe at a controlled rate, instead raises and lowers the gate electrodes. In order to carry out the automatic process, the Ametek apparatus was used to carry out both the raising and lowering processes, with the PES vial placed on a fixed surface, and executing the same stops. About one quarter of the fiber length was not dip coated by the PES solution, in order to form an interconnection point for the gate electrode. The PES dip coated fibers were then baked for about 15 hours at 175° C. The PES coating became much less soluble, forming the gate dielectric layer.

Each of the fibers was then individually attached to a piece of double-sided tape at the center of a micro-slide. A piece of one-sided scotch tape was also put over the exposed gate electrode of each of the partially-formed transistors, with a partial overlap onto the gate dielectric layer to create a gap preventing any shorting between the gate electrode and the semiconductor layer. Pentacene, the chosen semiconductor, was then deposited on the exposed portion of the gate dielectric layer by evaporation at about 1 Å/second for about 500 seconds and a pressure of about $5\times10^{-6}$ Torr, yielding a semiconductor layer on each fiber having a nominal thickness of about 500 Å.

In order to prepare source and drain electrodes, a metal screen having a mesh size of about 0.26 mm×0.24 mm was positioned over the semiconductor layer on each optical fiber. The width of the screen corresponded very well to the width of the fiber, so that a series of stripes along the longitudinal axis of each fiber were left exposed. The source and drain electrodes were then formed at the openings in the screen by evaporating gold at about 1/second for about 500 seconds at a pressure of $5\times10^{-6}$ Torr. The resulting source and drain electrodes had a width to length ("W/L") ratio of about 1.1, where L was about 0.24 mm. This constant value was assumed in all of the mobility calculations. In fact, the effective W/L ratio may have deviated somewhat from this value because of the unevenness of gold deposition around the circumference of the fiber, and also because of field lines that might have extended beyond the edges of the source and drain electrodes, but the deviations should have been similar for all of the devices tested because the same form of metal screen mask was used in every case.

The gold deposition for the preparation of the gate, source and drain electrodes on the optical fibers was not uniform because of the curvature in the fiber surface. There was a gradient of decreasing deposition thickness down and around the sides of a fiber from the flat line that marked the closest proximity of the optical fiber to the source of gold vapor. Accordingly, there was a corresponding gradient of decreasing conductivity down such sides. Capacitance per unit area and consequently charge carrier mobility, as measured in the resulting fiber transistors, are therefore expressed as an interval between minimum and maximum capacitances per unit area and mobilities, respectively. The minimum capacitance per unit area and maximum mobility values assume that the electrode surface extends across and half way around the entire circumference of the fiber for a distance of [(fiber diameter)×($\pi/2$)], and is evenly covered with 500 Å of gold. The maximum capacitance per unit area and minimum mobility values assume that the electrode surface extends across and around the fiber for a distance equal to the fiber diameter only.

A collection of 24 fiber transistors was prepared in the foregoing manner. The fiber transistors were then connected into an external test circuit using a Hewlett-Packard 4155A semiconductor parameter analyzer. Connections were made to a source and drain electrode pair, and to the gate electrode. Currents as a function of voltages applied to the drain and gate relative to the source were measured. Subsequently, the same transistors were connected to an external test circuit using a Hewlett-Packard 4284A Precision LCR meter. Connections were made to the gate electrode and to one other electrode on the upper surface of the gate dielectric or the semiconductor. Capacitance was measured at the lowest practical frequency, generally 100 to 1000 Hertz. The areas of the upper surface electrodes were measured using an optical microscope with a defined scale. In so doing, these transistors were tested for charge carrier mobility, on/off ratio, and on-current performance. The results are shown in Table 1.

In the sample column of the table, * designates a fiber transistor made using a 20% solution of PES in N,N-dimethylformamide, and ** designates a fiber transistor made using a 15% solution of PES in N,N-dimethylformamide, all of the other trials having used 25%. In the dipping conditions column of the table, M, S and A respectively designate manual, semi-automatic and automatic dipping. In manual mode trials, the numbers following the M, S and A designations indicate the number of stops during immersion of the gate electrodes in the PES solution, and during removal of the gate electrodes from the PES solution. For example, "4+4" means four stops during immersion and four stops during removal. In semi-automatic mode, "×1/10" means a speed of motion of 11μ/second. There were no stops during immersion or removal in the semi-automatic process.

In automatic mode, the numbers following the M, S and A designations refer to speeds of motion on the Ametek apparatus. In this regard, the designations 0, 1, 2, 3, 4, 8, 9 and 10 mean 0.025 cm/second ("cm/s"), 0.04 cm/s, 0.1 cm/s, 0.17 cm/s, 0.25 cm/s, 0.4 cm/s, 0.44 cm/s, and 0.5 cm/s, respectively. The first reported number in the dipping conditions column for the automatic trials is the immersion speed, and the second reported number is the removal speed. For example, "A: 10, 2" means automatic mode, immersion speed 10, removal speed 2. There were no stops during immersion or removal in the automatic process. In the off current and on current columns, V designates volts, pA designates pico amps, and nA designates nano amps. C/A*$10^{10}$ (min/max) designates the minimum and maximum capacitance measurements in farads per square centimeter, all results having been multiplied by $1\times10^{10}$ to simplify reporting of the tabled data. The mobility is expressed in cm$^2$/Vs.

TABLE 1

| Sample | Dipping conditions | Off(0 V)- Current | On(100 V)- Current | On/off- ratio | C/A * $10^{10}$ (min/max) | Mobility (min/max) |
|---|---|---|---|---|---|---|
| 1 | M: 6 + 6 | 396 pA | 55.4 nA | 139.899 | 8.16/12.8 | 0.00756/0.0119 |
| 2 | M: 6 + 6 | 3.04 nA | 87.4 nA | 28.75 | 8.16/12.8 | 0.00836/0.01312 |
| 3 | M: 4 + 4 | 24.1 nA | 105.7 nA | 4.3859 | 4.39/6.89 | 0.00761/0.01195 |
| 4 | M: 4 + 4 | 8.53 nA | 58 nA | 6.7995 | 4.39/6.89 | 0.00364/0.00571 |
| 5 | M: 4 + 4 | 23.5 nA | 106 nA | 4.5106 | 3.06/4.81 | 0.0083/0.01304 |
| 6 | S: x1/10 | 19.4 nA | 227 nA | 11.701 | 4.08/6.41 | 0.0334/0.0524 |
| 7 | S: x1/10 | 5.08 nA | 43 nA | 8.4646 | 2.55/4.006 | 0.01008/0.01584 |
| 8 | S: x1/10 | 31.7 nA | 283 nA | 8.9274 | 2.55/4.006 | 0.058848/0.0924 |
| 9 | S: x1/10 | 23.5 nA | 229 nA | 9.74468 | 2.55/4.006 | 0.04936/0.0776 |
| 10 | S: x1/10 | 21.8 nA | 159.4 nA | 7.3119 | 7.37/11.58 | 0.01218/0.01927 |

TABLE 1-continued

| Sample | Dipping conditions | Off(0 V)-Current | On(100 V)-Current | On/off-ratio | C/A * $10^{10}$ (min/max) | Mobility (min/max) |
|---|---|---|---|---|---|---|
| 11* | A: 10, 0 | 53.3 nA | 393 nA | 7.3734 | 13.3/20.08 | 0.01413/0.02219 |
| 12 | A: 10, 1 | 174 pA | 154 nA | 88.5 | 3.69/5.79 | 0.0057/0.0089 |
| 13* | A: 10, 2 | 46 nA | 793 nA | 17.4 | 17.3/27.2 | 0.0271/0.0425 |
| 14* | A: 10, 2 | 28 nA | 684 nA | 24.3 | 14.3/22.4 | 0.0366/0.0576 |
| 15* | A: 10, 2 | 25 nA | 737 nA | 29.0 | 10.2/16.0 | 0.0583/0.0915 |
| 16* | A: 10, 2 | 57 nA | 886 nA | 15.5 | 25.5/40.1 | 0.0379/0.0594 |
| 17* | A: 10, 2 | 60 nA | 400 nA | 6.72 | 12.8/20.0 | 0.0116/0.0183 |
| 18* | A: 10, 2 | 50 nA | 430 nA | 8.66 | 10.9/17.1 | 0.0203/0.0319 |
| 19* | A: 10, 2 | 44 nA | 529 nA | 12.1 | 10.2/16.0 | 0.0317/0.0499 |
| 20* | A: 10, 2 | 104 nA | 513 nA | 4.94 | 10.2/16.0 | 0.0179/0.0282 |
| 21* | A: 10, 2 | 81 nA | 546 nA | 6.78 | 9.35/14.7 | 0.0260/0.0408 |
| 22 ** | A: 10, 10 | 69 pA | 430 nA | 6232 | 14.3/22.4 | 0.0351/0.0552 |
| 23 ** | A: 10, 10 | 515 pA | 613 nA | 1190 | 10.2/16.0 | 0.0691/0.1086 |
| 24 ** | A: 10, 10 | 414 pA | 770 nA | 1860 | 10.2/16.0 | 0.0911/0.1431 |

Figure 7:
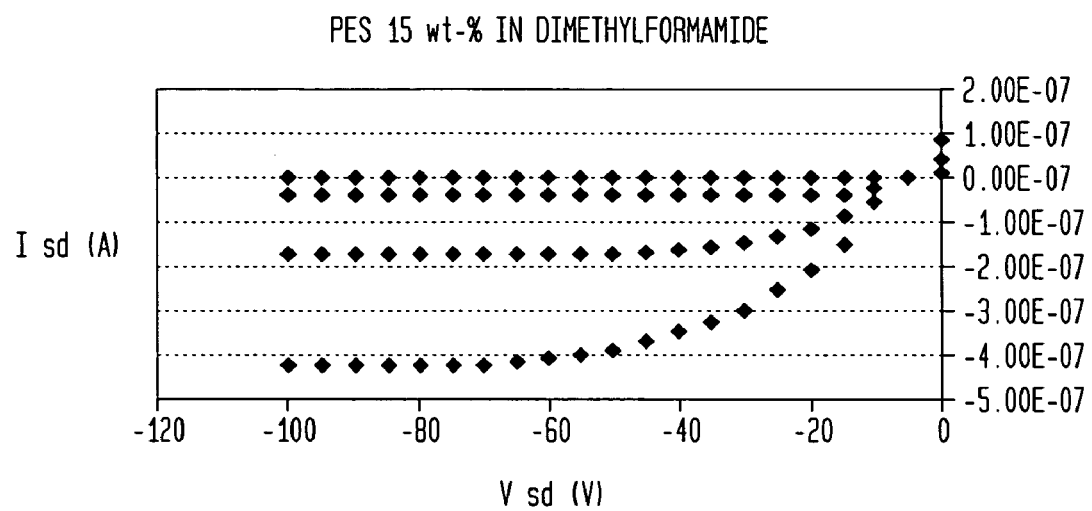
FIG. 7 shows a plot of a voltage applied between the source and drain electrodes versus output current for trial number 22.

The highest on/off ratio for dip-coated PES among the fiber transistors for which test results are reported in Table 1, was reported in trial number 22. FIG. 7 plots detailed test results for this transistor. The horizontal x axis represents a negative voltage V applied between the source and drain electrodes, in volts. The vertical y axis represents the output current I measured at the drain, in amperes. There are six curves of data shown in the figure, representing negative gate voltages of 0, 20, 40, 60, 80 and 100 volts proceeding from the top to bottom of the left hand side of the graph. The data for negative gate voltages of 0, 20 and 40 volts closely overlap together. The on current measured at an applied negative gate voltage of 100 volts, was 429.6 nA. The off current measured at an applied negative gate voltage of 0 volts, was 69.26 pA. The on/off ratio was 6232.

Figure 8:
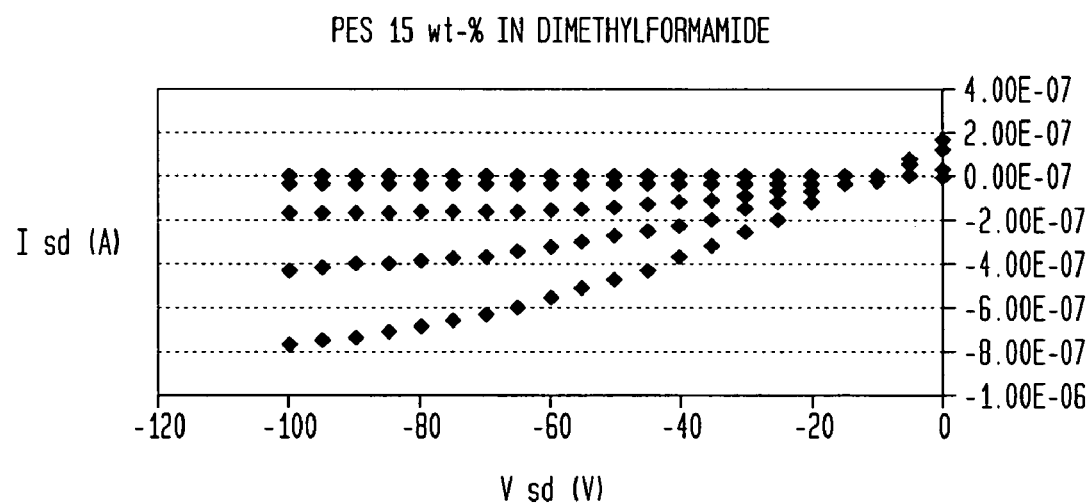
FIG. 8 shows a plot of a voltage applied between the source and drain electrodes versus output current for trial number 24.

The highest mobility for dip-coated PES among the fiber transistors for which test results are reported in Table 1, was reported in trial number 24. This trial also yielded the $3^{rd}$ highest on-current in Example 1. FIG. 8 plots detailed test results for this transistor. The horizontal x axis represents a voltage V applied to the source electrode in volts. The vertical y axis represents the output current I measured at the drain, in amperes. There are six curves of data shown in the figure, representing negative gate voltages of 0, 20, 40, 60, 80 and 100 volts proceeding from the top to bottom of the left hand side of the graph. The data for negative gate voltages of 0 and 20 volts closely overlap together. The minimum and maximum mobilities measured for this transistor were 0.0911 cm²/Vs and 0.1431 cm2 Vs, respectively.

Figure 9:
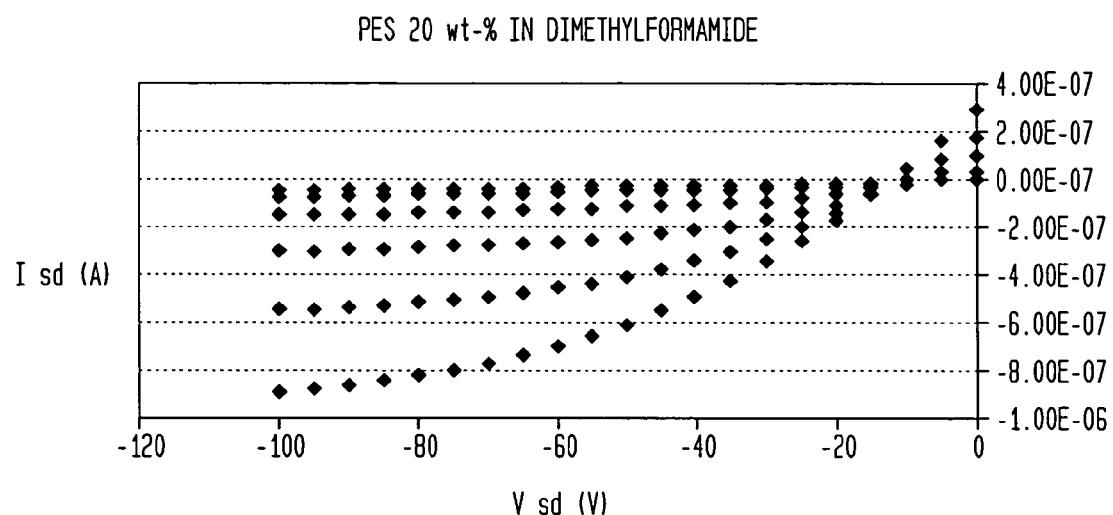
FIG. 9 shows a plot of a voltage applied between the source and drain electrodes versus output current for trial number 16.

The highest on-current for dip-coated PES among the fiber transistors for which test results are reported in Table 1, was reported in trial number 16. This trial also yielded the $6^{th}$ highest mobility and the $9^{th}$ highest on/off ratio in Example 1. FIG. 9 plots detailed test results for this transistor. The horizontal x axis represents a voltage V applied to the source electrode in volts. The vertical y axis represents the output current I measured at the drain, in amperes. There are six curves of data shown in the figure, representing negative gate voltages of 0, 20, 40, 60, 80 and 100 volts proceeding from the bottom to the top of the left hand side of the graph. The measured on-current for this transistor was 886 nA.

Overall, these trials show that the manual dip coating process generally did not provide a steady dip coating rate to facilitate generation of smooth dielectric polymer coatings. Such smooth coatings are desirable for making transistors having high on-currents and high mobilities. The semi-automatic dip coating process provided a more steady dip coating rate than did the manual dip coating process. The automatic dip coating process provided a steadier dip coating rate than did the semi-automatic and the manual dip coating processes, resulting in a smoother polymer film yielding higher on/off ratios, higher on-currents and higher mobilities.

When using a high concentration of poly (ethersulfone), a relatively slow dip coating rate was desirable to reduce capillary forces. However, at such slow dip coating rates, solvent may tend to evaporate before the polymer solution is deposited on the fiber, leading to a regionally thicker dielectric coating and a film having a rougher surface. When using a low concentration of poly (ethersulfone), a relatively fast dip coating rate was desirable to maintain adequate capillary forces. At these higher dip coating rates, less solvent may tend to evaporate before the polymer solution is deposited on the fiber, leading to fewer spots of regionally thicker dielectric coating, and an overall smoother film.

EXAMPLE 2

Polyimide

A series of fiber transistors was made, each including a polyimide gate dielectric layer. The same procedures as reported in Example 1 were used to make these transistors, except that in substitution for poly (ethersulfone), a solution of polyimide, obtained from Amoco Chemical Company, 150 W. Warrenville Road, E-2F, Naperville, Ill. 60563, Lot No: 18478062, MSDS No: 09390000 ("PI") was dissolved in cyclopentanone. In general, measured amounts of 2 g of PI and 22 g of cyclopentanone were used, constituting 8.3% PI by weight. However, in the sample column of the table, * designates a fiber transistor made using a 4% solution of PI in cyclopentanone, ** designates a fiber transistor made using a 6% solution of PI in cyclopentanone, and all of the other trials used 8.3%. The PI appeared to completely dissolve after stirring for a few hours at room temperature and after additional heating to a temperature of 100° C., forming a PI solution.

A collection of 36 fiber transistors was prepared in the foregoing manner. The fiber transistors were then connected into an external test circuit in the same manner as discussed in Example 1. These transistors were then tested for charge carrier mobility, on/off ratio, and on-current performance. The results are shown in Table 2. In the on current column, "mic-A" designates micro amps. In other respects, the abbreviations in Table 2 have the same meanings as discussed in connection with Table 1.

TABLE 2

| Sample | Dipping conditions | Off(0 V)-Current | On(100 V)-Current | On/off-ratio | C/A * $10^{10}$ (min/max) | Mobility (min/max) |
|---|---|---|---|---|---|---|
| 25 | M: 1 + 1 | 7.33 nA | 939 nA | 128 | 30.6/48.1 | 0.0315/0.0495 |
| 26 | M: 1 + 1 | 29.3 nA | 149.4 nA | 5.09 | 301/481 | 0.0002/0.0003 |
| 27 | M: 4 + 4 | 53.5 nA | 3.31 mic-A | 61.75 | 27.6/43.3 | 0.1079/0.1695 |
| 28 | M: 4 + 4 | 44.8 nA | 3.22 mic-A | 71.86 | 27.6/43.3 | 0.1075/0.1688 |
| 29 | M: 4 + 4 | 6.05 nA | 1.22 mic-A | 201 | 34.7/54.5 | 0.0359/0.05646 |
| 30 | M: 4 + 4 | 4.11 nA | 1.09 mic-A | 266 | 30.6/48.1 | 0.0377/0.05926 |
| 31 | M: 4 + 4 | 4.27 nA | 718.4 nA | 168 | 15.3/24.0 | 0.0478/0.075 |
| 32 | M: 4 + 4 | 9.81 nA | 1.07 mic-A | 109 | 27.6/43.3 | 0.0377/0.059 |
| 33 | M: 4 + 4 | 22.4 nA | 383.65 nA | 17.1 | 15.3/24.0 | 0.0171/0.02690 |
| 34 | M: 4 + 4 | 21.7 nA | 1.12 mic-A | 51.7 | 1.22/1.92 | 0.0805/0.12646 |
| 35 | M: 4 + 4 | 10.1 nA | 113 nA | 11.2 | 1.53/2.40 | 0.0043/0.0068 |
| 36 | M: 4 + 4 | 38.3 nA | 2.39 mic-A | 62.5 | 58.2/91.3 | 0.0371/0.0582 |
| 37 | A: 10, 0 | 16.3 nA | 68.6 nA | 4.2 | 8.16/12.8 | 0.0028/0.0044 |
| 38 | A: 10, 0 | 169 nA | 424.4 nA | 2.5 | 10.2/16.0 | 0.0066/0.01033 |
| 39 | A: 10, 0 | 158 nA | 550.5 nA | 3.48 | 15.3/24.0 | 0.0090/0.01411 |
| 40 | A: 10, 0 | 185 nA | 824.0 nA | 4.45 | 20.4/32.1 | 0.0134/0.02108 |
| 41 | A: 10, 0 | 104 nA | 956.3 nA | 9.18 | 20.4/32.1 | 0.0245/0.03846 |
| 42 | A: 3, 3 | 97.2 nA | 168.4 nA | 1.93 | 5.10/8.01 | 0.0031/0.00481 |
| 43 | A: 3, 3 | 11.2 nA | 67.06 nA | 5.99 | 1.33/2.08 | 0.0206/0.0324 |
| 44 | A: 3, 3 | 188 nA | 380.2 nA | 2.29 | 8.16/12.8 | 0.0111/0.0175 |
| 45 | A: 3, 3 | 299 nA | 683.3 nA | 2.29 | 10.2/16.0 | 0.0089/0.0140 |
| 46 | A: 3, 3 | 274 nA | 1.20 mic-A | 4.38 | 9.18/14.4 | 0.0421/0.0661 |
| 47 | A: 10, 3 | 59.4 nA | 385 nA | 6.49 | 15.3/24.0 | 0.0111/0.0175 |
| 48 ** | A: 8, 8 | 239 nA | 4.32 mic-A | 18.1 | 20.4/32.1 | 0.1527/0.2399 |
| 49 * | A: 8, 8 | 6.38 nA | 2.63 mic-A | 413 | 20.4/32.1 | 0.1390/0.2183 |
| 50 * | A: 10, 10 | 7.19 nA | 3.04 mic-A | 423 | 22.4/35.3 | 0.1502/0.2359 |
| 51 * | A: 10, 10 | 2.37 nA | 5.11 mic-A | 2154 | 25.5/40.1 | 0.2312/0.3632 |
| 52 * | A: 10, 10 | 55.5 nA | 6.02 mic-A | 109 | 30.6/48.1 | 0.2029/0.3186 |
| 53 * | A: 10, 10 | 42.1 nA | 6.47 mic-A | 154 | 22.5/35.3 | 0.2909/0.4569 |
| 54 * | A: 10, 10 | 91.1 nA | 7.70 mic-A | 84.5 | 22.5/35.3 | 0.3233/0.5077 |
| 55 * | A: 10, 10 | 5.27 nA | 5.44 mic-A | 103 | 51.0/80.1 | 0.1232/0.1935 |
| 56 * | A: 10, 10 | 533 pA | 487 nA | 91.4 | 20.4/32.1 | 0.0284/0.0445 |
| 57 * | A: 10, 10 | 40.0 nA | 9.26 mic-A | 232 | 71.4/112 | 0.1360/0.2135 |
| 58 * | A: 10, 10 | 6.14 nA | 5.89 mic-A | 959 | 30.6/48.1 | 0.2246/0.3527 |
| 59 ** | A: 10, 10 | 4.70 nA | 2.03 mic-A | 430 | 20.4/32.1 | 0.1073/0.1685 |
| 60 ** | A: 10, 10 | 1.07 nA | 1.44 mic-A | 1340 | 13.3/20.8 | 0.1232/0.1935 |

Figure 10:
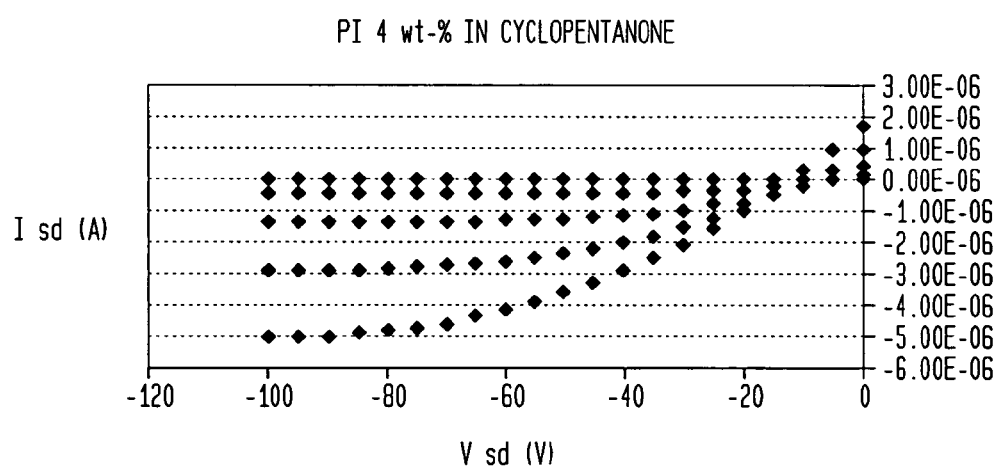
FIG. 10 shows a plot of a voltage applied between the source and drain electrodes versus output current for trial number 51.

The highest on/off ratio for dip-coated PI among the fiber transistors for which test results are reported in Table 2, was reported in trial number 51. This trial also yielded the 6$^{th}$ highest mobility and the 3$^{rd}$ highest on-current for Example 2. FIG. 10 plots detailed test results for this transistor. The horizontal x axis represents a voltage V applied to the source electrode, in volts. The vertical y axis represents the output current I measured at the drain, in amperes. There are six curves of data shown in the figure, representing negative gate voltages of 0, 20, 40, 60, 80 and 100 volts proceeding from the top to bottom of the left hand side of the graph. The data for negative gate voltages of 0 and 20 volts closely overlap together. The on-current measured at an applied negative gate voltage of 100 volts, was 5.11 mic-A. The off-current measured at an applied negative gate voltage of 0 volts, was 2.37 nA. The on/off ratio was 2154.

Figure 11:
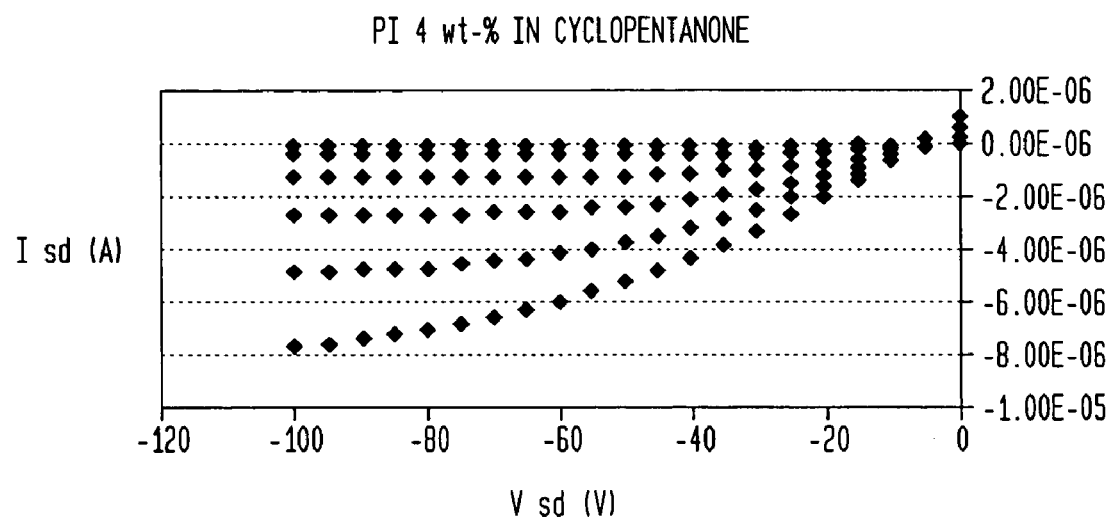
FIG. 11 shows a plot of a voltage applied between the source and drain electrodes versus output current for trial number 54.

The highest mobility for dip-coated PI among the fiber transistors for which test results are reported in Table 2, was reported in trial number 54. This trial also yielded the 2$^{nd}$ highest on-current in Example 2. FIG. 11 plots detailed test results for this transistor. The horizontal x axis represents a voltage V applied to the source electrode in volts. The vertical y axis represents the output current I measured at the drain, in amperes. There are six curves of data shown in the figure, representing negative gate voltages of 0, 20, 40, 60, 80 and 100 volts proceeding from the top to bottom of the left hand side of the graph. The minimum and maximum mobilities measured for this transistor were 0.3233 cm$^2$/Vs and 0.5077 cm$^2$/Vs, respectively. This test result was the highest mobility observed among all of the data presented in Examples 1–4.

Figure 12:
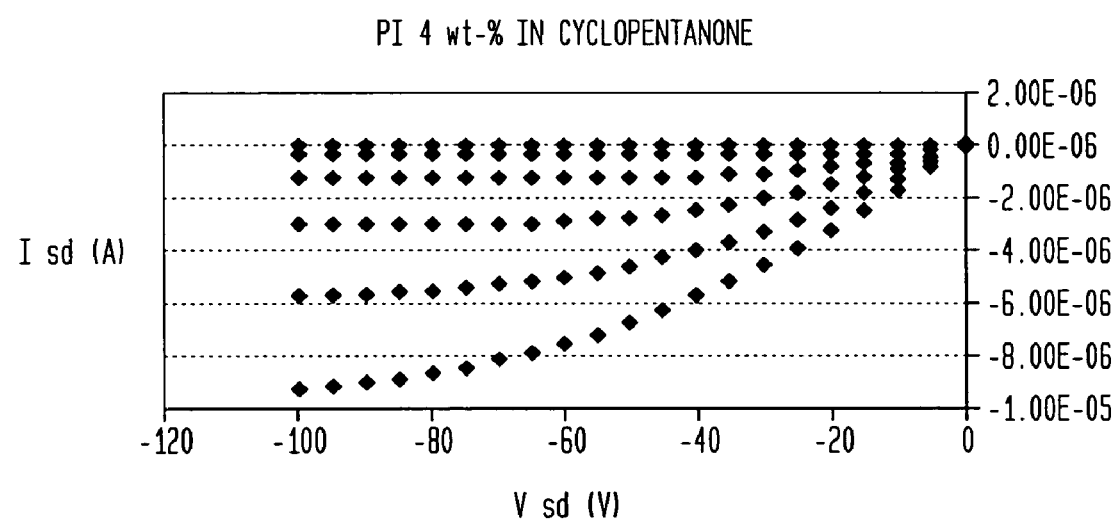
FIG. 12 shows a plot of a voltage applied between the source and drain electrodes versus output current for trial number 57.

The highest on-current for dip-coated PI among the fiber transistors for which test results are reported in Table 2, was reported in trial number 57. This trial also yielded the 9$^{th}$ highest mobility and the 8$^{th}$ highest on/off ratio in Example 2. FIG. 12 plots detailed test results for this transistor. The horizontal x axis represents a voltage V applied to the source electrode in volts. The vertical y axis represents the output current I measured at the drain, in amperes. There are six curves of data shown in the figure, representing negative gate voltages of 0, 20, 40, 60, 80 and 100 volts proceeding from the top to the bottom of the left hand side of the graph. The measured on-current for this transistor was 9.26 mic-A.

Overall, these results show that carrying out the manual dip coating in 4+4 steps with 4 stops in the immersion and removal processes allowed for a steadier dip coating rate than the manual dip coating in 1+1 steps. The fluctuation in the dip coating rate was smaller within each of the four segments of the 4+4 dip coating process than in the one large segment of the 1+1 process. The steadier 4+4 dip coating rate yielded a smoother film, which is desirable for producing transistors performing with high on-currents, on/off ratios and mobilities. The capillary forces were also more continuous in the 4+4 dip coating process than in the 1+1 process. The results further show that the automatic dip coating process provided a steadier dip coating rate than did the manual dip coating process, resulting in a smoother polymer film yielding higher on/off ratios, higher on-currents and higher mobilities.

EXAMPLE 3

Poly (Methylmethacrylate)

A series of fiber transistors was made, each including a poly (methylmethacrylate) gate dielectric layer. The same procedures as reported in Example 1 were used to make these transistors, except that in substitution for poly (ethersulfone), a solution of poly (methylmethacrylate) having a viscosity average molecular weight of approximately 120,000 Mv ("PMMA") was dissolved in cyclopentanone. In general, measured amounts of 1.05 g of PMMA and 10.55 g of cyclopentanone were used, constituting 10% PMMA by weight. However, in the sample column of the table, * designates a fiber transistor made using a 8.3% solution of PMMA in cyclopentanone. The PMMA appeared to completely dissolve after stirring for a few hours at room temperature and after additional heating to a temperature of 100° C., forming a PMMA solution.

A collection of 15 fiber transistors was prepared in the foregoing manner. The fiber transistors were then connected into an external test circuit in the same manner as discussed in Example 1. These transistors were then tested for charge carrier mobility, on/off ratio, and on-current performance. The results are shown in Table 3, in which the abbreviations have the same meanings as discussed in connection with Table 1.

TABLE 3

| Sample | Dipping conditions | Off(0 V)-Current | On(100 V)-Current | On/off-ratio | C/A * $10^{10}$ (min/max) | Mobility (min/max) |
|---|---|---|---|---|---|---|
| 61 | M: 1 + 1 | 504 pA | 92.6 nA | 184 | 15.3/24.0 | 0.00622/0.0098 |
| 62 | M: 1 + 1 | 1.99 nA | 183 nA | 92.3 | 27.6/43.3 | 0.00664/0.0104 |
| 63 | M: 1 + 1 | 6.91 nA | 633 nA | 91.6 | 27.6/43.3 | 0.0231/0.0363 |
| 64 | M: 1 + 1 | 5.23 nA | 678 nA | 130 | 10.2/16.0 | 0.0684/0.1075 |
| 65 | M: 1 + 1 | 26.3 nA | 174 nA | 6.66 | 21.4/33.7 | 0.0034/0.0053 |
| 66 | M: 1 + 1 | 86.1 nA | 310 nA | 3.62 | 23.0/36.1 | 0.0032/0.0050 |
| 67 | A: 3, 3 | 3.18 nA | 41.4 nA | 13 | 5.10/8.01 | 0.0049/0.0077 |
| 68 | A: 3, 3 | 333 pA | 993 pA | 2.98 | 1.43/2.24 | 0.00015/0.00024 |
| 69 | A: 10, 0 | 18 nA | 122 nA | 6.67 | 9.18/14.4 | 0.0055/0.0087 |
| 70 | A: 10, 0 | 11 nA | 161 nA | 14.6 | 11.2/17.6 | 0.0091/0.0143 |
| 71 | M: 4 + 4 | 1.62 nA | 106 nA | 60.6 | 5.10/8.01 | 0.0182/0.0285 |
| 72 * | A: 4, 4 | 280 pA | 626 nA | 2234 | 17.3/27.2 | 0.0433/0.0680 |
| 73 * | A: 4, 4 | 1.16 nA | 719 nA | 619 | 16.3/25.6 | 0.0511/0.0803 |
| 74 * | A: 4, 4 | 3.21 nA | 879 nA | 274 | 17.3/27.2 | 0.0544/0.0855 |
| 75 * | A: 4, 4 | 4.06 nA | 901 nA | 222 | 16.3/25.6 | 0.0591/0.0928 |

Figure 13:
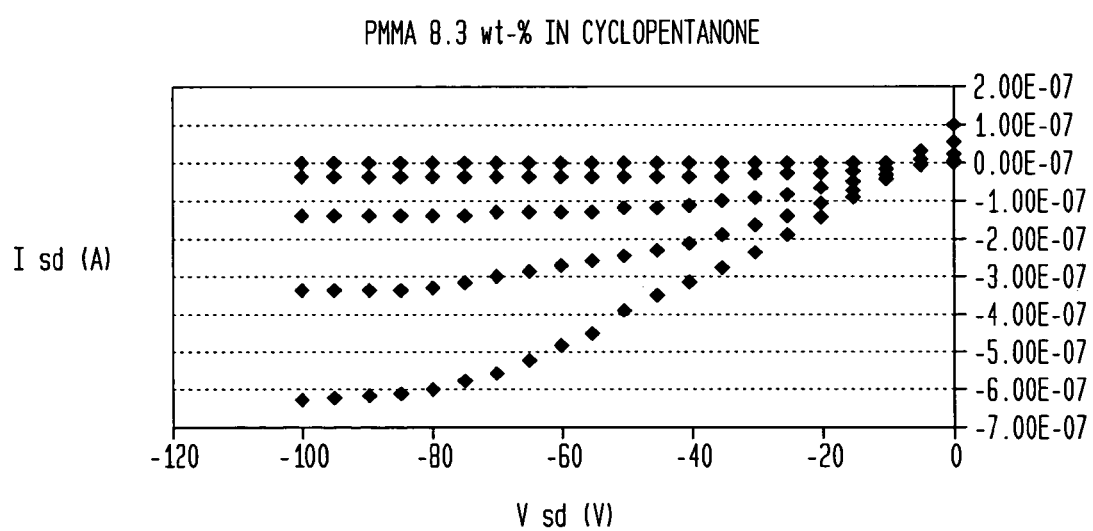
FIG. 13 shows a plot of a voltage applied between the source and drain electrodes versus output current for trial number 72.

The highest on/off ratio for dip-coated PMMA among the fiber transistors for which test results are reported in Table 3, was reported in trial number 72. This trial also yielded the 5$^{th}$ highest mobility and 6$^{th}$ highest on-current for Example 3. FIG. 13 plots detailed test results for this transistor. The horizontal x axis represents a voltage V applied to the source electrode, in volts. The vertical y axis represents the output current I measured at the drain, in amperes. There are six curves of data shown in the figure, representing negative gate voltages of 0, 20, 40, 60, 80 and 100 volts proceeding from the top to the bottom of the left hand side of the graph. The data for negative gate voltages of 0 and 20 volts closely overlap together. The on current measured at an applied negative gate voltage of 100 volts, was 626 nA. The off current measured at an applied negative gate voltage of 0 volts, was 280 pA. The on/off ratio was 2234.

Figure 14:
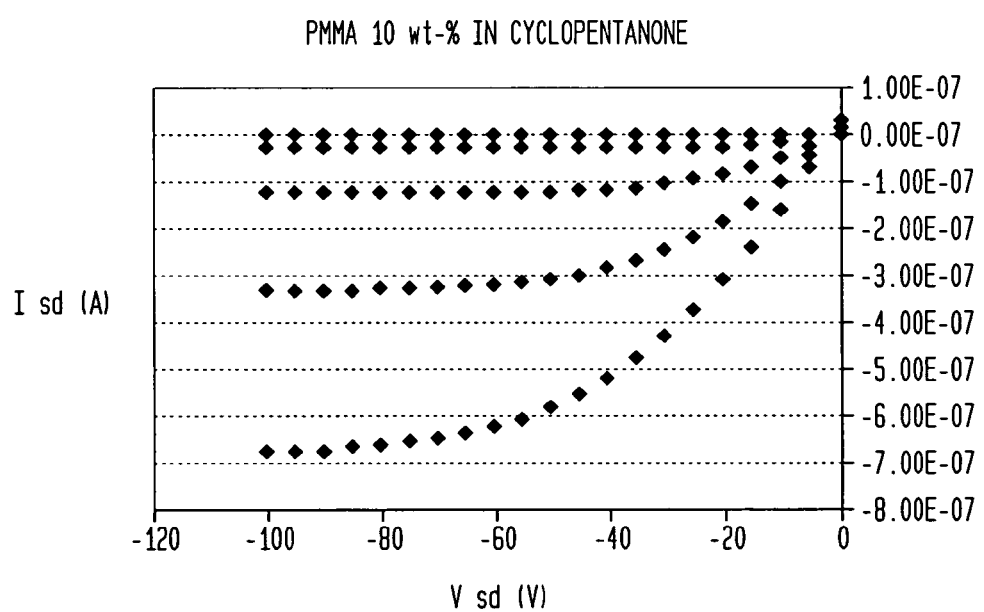
FIG. 14 shows a plot of a voltage applied between the source and drain electrodes versus output current for trial number 64.

The highest mobility for dip-coated PMMA among the fiber transistors for which test results are reported in Table 3, was reported in trial number 64. This trial also yielded the 4$^{th}$ highest on-current and the 6$^{th}$ highest on/off ratio in Example 3. FIG. 14 plots detailed test results for this transistor. The horizontal x axis represents a voltage V applied to the source electrode in volts. The vertical y axis represents the output current I measured at the drain, in amperes. There are six curves of data shown in the figure, representing negative gate voltages of 0, 20, 40, 60, 80 and 100 volts proceeding from the top to bottom of the left hand side of the graph. The data for negative gate voltages of 0 and 20 volts closely overlap together. The minimum and maximum mobilities measured for this transistor were 0.0684 cm$^2$/Vs and 0.1075 cm$^2$/Vs, respectively.

Figure 15:
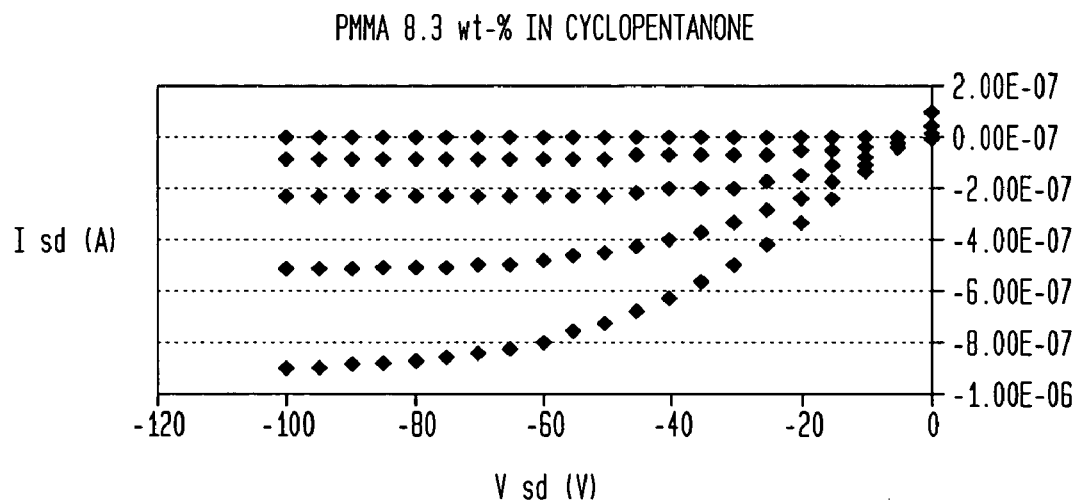
FIG. 15 shows a plot of a voltage applied between the source and drain electrodes versus output current for trial number 75.

The highest on-current for dip-coated PMMA among the fiber transistors for which test results are reported in Table 3, was reported in trial number 75. This trial also yielded the 2nd highest mobility and the 4$^{th}$ highest on/off ratio in Example 3. FIG. 15 plots detailed test results for this transistor. The horizontal x axis represents a voltage V applied to the source electrode in volts. The vertical y axis represents the output current I measured at the drain, in amperes. There are six curves of data shown in the figure, representing negative gate voltages of 0, 20, 40, 60, 80 and 100 volts proceeding from the top to the bottom of the left hand side of the graph. The data for negative gate voltages of 0 and 20 volts closely overlap together. The measured on-current for this transistor was 901 nA.

Overall, these results show that a fast dip coating rate at a high dielectric solution concentration resulted in high capillary forces, making the dielectric coating too thick to yield a high on-current, resulting in a low on/off ratio and low mobility. Automatic dip coating may permit a slower dip coating rate thereby yielding a thinner dielectric coating and thus higher on-current, on/off ratio and mobility performance. At a lower dielectric solution concentration, a faster dip coating rate could be used, yielding a thin dielectric coating and higher on-currents, resulting in higher on/off ratios and generally higher mobilities.

EXAMPLE 4

Polycarbonate

A series of fiber transistors was made, each including a polycarbonate gate dielectric layer. The same procedures as reported in Example 1 were used to make these transistors, except that in substitution for poly (ethersulfone), a solution of polycarbonate, Aldrich Chemical Co. catalog No: 18.162-5, 250g. n(D)=1.5850, d=1.200 ("PC") was dissolved in cyclopentanone. Three different polycarbonate solutions were made including 10%, 15% and 20% by weight of polycarbonate and designated as PC solutions A, B and C respectively. For example, PC solution A was made by dissolving 1 g of PC in 9 g of cyclopentanone. The PC appeared to completely dissolve after stirring for a few hours at room temperature and after additional heating to a temperature of 100° C. forming a PC solution.

A collection of 11 fiber transistors was prepared in the foregoing manner. The fiber transistors were then connected into an external test circuit in the same manner as discussed in Example 1. These transistors were then tested for charge carrier mobility, on/off ratio, and on-current performance. The results are shown in Table 4. In the sample column, A, B and C indicate PC solutions A, B and C, respectively. In other respects the abbreviations have the same meanings as discussed in connection with Table 1.

TABLE 4

| Sample | Dipping conditions | Off(0 V)-Current | On(100 V)-Current | On/off-ratio | C/A * $10^{10}$ (min/max) | Mobility (min/max) |
|---|---|---|---|---|---|---|
| 76 (A) | A: 10, 10 | 117 pA | 800 nA | 6830 | 11.2/17.6 | 0.0925/0.1453 |
| 77 (A) | A: 10, 10 | 563 pA | 655 nA | 1160 | 11.2/17.6 | 0.0686/0.1077 |
| 78 (A) | A: 10, 10 | 45 pA | 56.6 nA | 1260 | 11.2/17.6 | 0.0063/0.0100 |
| 79 (A) | A: 10, 10 | 401 pA | 362 nA | 905 | 6.12/9.62 | 0.0692/0.1086 |
| 80 (A) | A: 10, 10 | 506 pA | 1.45 mic-A | 2870 | 10.2/16.0 | 0.1774/0.2786 |
| 81 (A) | A: 10, 10 | 242 pA | 390 nA | 1610 | 9.18/14.4 | 0.0532/0.0835 |
| 82 (B) | M: 4, 4 | 791 pA | 101 nA | 128 | 10.2/16.0 | 0.0112/0.0176 |
| 83 (B) | M: 4, 4 | 749 pA | 190 nA | 254 | 15.3/24.0 | 0.0142/0.0223 |
| 84 (B) | M: 4, 4 | 6.38 nA | 120 nA | 18.9 | 10.2/16.0 | 0.0085/0.0133 |
| 85 (B) | M: 4, 4 | 3.77 nA | 400 nA | 106 | 14.3/22.4 | 0.0289/0.0454 |
| 86 (C) | M: 4, 4 | 245 pA | 46.5 nA | 190 | 3.06/4.81 | 0.0151/0.0237 |

Figure 16:
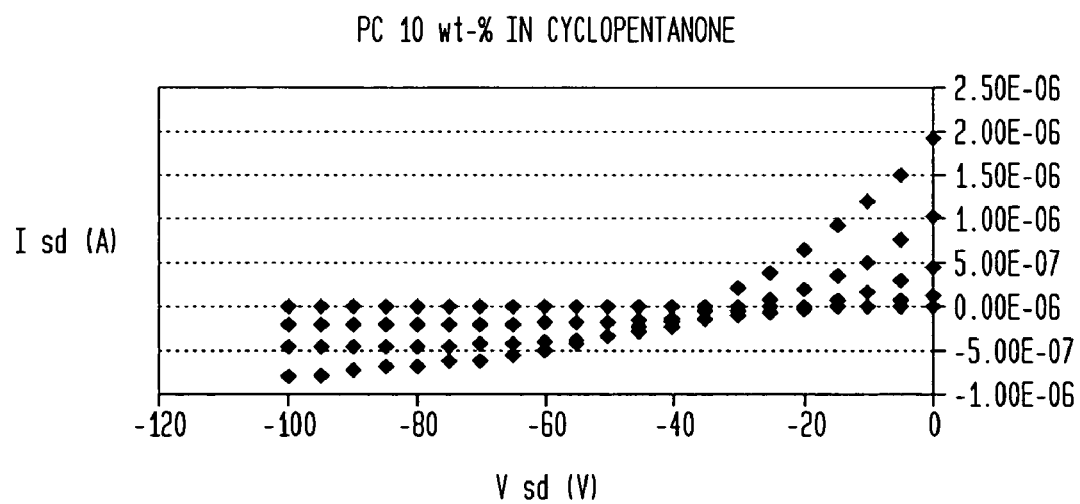
FIG. 16 shows a plot of a voltage applied between the source and drain electrodes versus output current for trial number 76.

The highest on/off ratio for dip-coated PC among the fiber transistors for which test results are reported in Table 4, was reported in trial number 76. FIG. 16 plots detailed test results for this transistor. The horizontal x axis represents a voltage V applied to the source electrode, in volts. The vertical y axis represents the output current I measured at the drain, in amperes. There are six curves of data shown in the figure, representing negative gate voltages of 0, 20, 40, 60, 80 and 100 volts proceeding from the top to bottom of the left hand side of the graph. The data for negative gate voltages of 0, 20 and 40 volts closely overlap together. The on current measured at an applied negative gate voltage of 100 volts, was 800 nA. The off current measured at an applied negative gate voltage of 0 volts, was 117 pA. The on/off ratio was 6830. This test result was the highest on/off ratio observed among all of the data presented in Examples 1–4. This transistor also yielded the second highest on-current and second highest mobility in Example 4.

Figure 17:
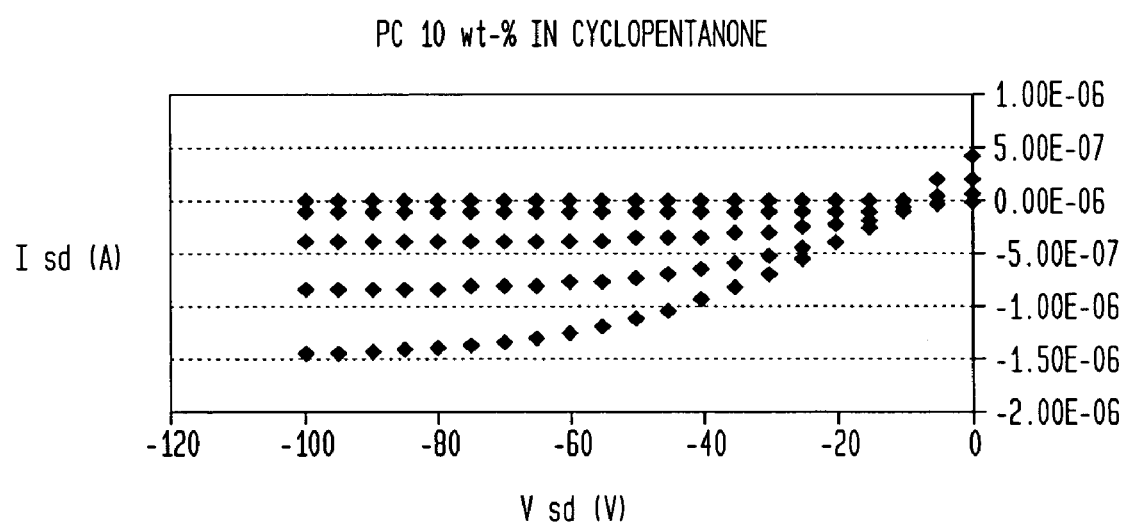
FIG. 17 shows a plot of a voltage applied between the source and drain electrodes versus output current for trial number 80.

The highest mobility and on-current for dip-coated PC among the fiber transistors for which test results are reported in Table 4, was reported in trial number 80. FIG. 17 plots detailed test results for this transistor. The horizontal x axis represents a voltage V applied to the source electrode, in volts. The vertical y axis represents the output current I measured at the drain, in amperes. There are six curves of data shown in the figure, representing negative gate voltages of 0, 20, 40, 60, 80 and 100 volts proceeding from the top to bottom of the left hand side of the graph. The data for negative gate voltages of 0 and 20 volts closely overlap together. The minimum and maximum mobilities measured for this transistor were 0.1774 cm2/Vs and 0.2786 cm2/Vs, respectively. The measured on-current for this transistor was 1.45 mic-A. This transistor also yielded the third highest on/off ratio in Example 4.

While the present invention has been disclosed in the context of various aspects of presently preferred embodiments, it will be recognized that the invention may be suitably applied to other environments consistent with the claims which follow.

We claim:

1. An apparatus, comprising:
    a fiber having an electrically conductive outer surface and having an average diameter of less than about 5 millimeters; and
    a dielectric polymeric layer comprising a polymer having a main polymer chain on said outer surface, said dielectric polymeric layer having a thickness of less than about 50 microns, said main polymer chain comprising carbon.

2. The apparatus of claim 1, in which said dielectric polymeric layer comprises dipolar moieties having a dipole moment of at least about 1 Debye.

3. The apparatus of claim 2, in which said dielectric polymeric layer comprises a polymer selected from the group consisting of polycarbonates, polyimides, poly (ethersulfones) and polyacrylates.

4. A method for making a coated fiber, comprising the steps of:
    providing a fiber having an electrically conductive outer surface and an average diameter of less than about 5 millimeters; and
    forming a dielectric polymeric layer comprising a polymer having a main polymer chain on said outer surface, said dielectric polymeric layer having a thickness of less than about 50 microns, said main polymer chain comprising carbon.

5. The method of claim 4 comprising the further steps of:
    providing a solution of a polymer comprising dipolar moieties having a dipole moment of at least about 1 Debye; and
    forming said dielectric polymeric layer from said solution.

6. The method of claim 4, further comprising the step of forming said dielectric polymeric layer on said outer surface by dip-coating said fiber with a solution, the solution comprising a precursor for said dielectric polymeric layer.

7. The method of claim 5, in which said dielectric polymeric layer comprises a polymer selected from the group consisting of polycarbonates, polyimides, poly (ethersulfones) and polyacrylates.

8. A fiber transistor, comprising:
    an insulating fiber having an average diameter of less than about 5 millimeters;

a gate electrode on said insulating fiber;

a dielectric polymeric layer comprising a polymer having a main polymer chain on said gate electrode, the dielectric polymeric layer having a thickness of less than about 50 microns, said main polymer chain comprising carbon;

a semiconductor layer and source and drain electrodes on said dielectric polymeric layer, said source and drain electrodes being in contact with said semiconductor layer;

said fiber transistor having an on/off ratio of at least about 10.

9. The fiber transistor of claim 8, in which said dielectric polymeric layer comprises dipolar moieties having a dipole moment of at least about 1 Debye.

10. The fiber transistor of claim 8, in which said source and drain electrodes form spaced apart spirals around a circumference of said dielectric polymeric layer, said source and drain electrodes being in contact with said semiconductor layer.

11. The fiber transistor of claim 8, in which the semiconductor layer has a charge carrier mobility of at least about 0.01 $cm^2/Vs$.

12. The fiber transistor of claim 9, in which said dielectric polymeric layer comprises a polymer selected from the group consisting of polycarbonates, polyimides, poly (ethersulfones) and polyacrylates.

13. A fiber transistor, comprising:

an insulating fiber having an average diameter of less than about 5 millimeters;

a semiconductor layer and source and drain electrodes on said insulating fiber, said source and drain electrodes being in contact with said semiconductor layer;

a dielectric polymeric layer comprising a polymer having a main polymer chain on said semiconductor layer, the dielectric polymeric layer having a thickness of less than about 50 microns, said main polymer chain comprising carbon; and a gate electrode on said dielectric polymeric layer;

said fiber transistor having an on/off ratio of at least about 10.

14. A method for making a fiber transistor, comprising the steps of:

providing an insulating fiber having an average diameter of less than about 5 millimeters;

forming a gate electrode on said insulating fiber;

forming a dielectric polymeric layer comprising a polymer having a main polymer chain on said gate electrode, the dielectric polymeric layer having a thickness of less than about 50 microns, said main polymer chain comprising carbon;

forming a semiconductor layer and a source electrode and a drain electrode on said dielectric layer, said source and drain electrodes being in contact with said semiconductor layer;

in which said fiber transistor has an on/off ratio of at least about 10.

15. The method of claim 14 comprising the further steps of:

providing a solution of a polymer comprising dipolar moieties having a dipole moment of at least about 1 Debye; and forming said dielectric polymeric layer from said solution.

16. The method of claim 14, comprising the further step of forming said dielectric polymeric layer on said gate electrode by dip-coating said fiber in a solution, the solution comprising a precursor for said dielectric polymeric layer.

17. The method of claim 14, comprising the further step of forming source and drain electrodes as spaced apart spirals around a circumference of said dielectric polymeric layer, the semiconductor layer forming a channel region between said source and drain electrodes.

18. The method of claim 15, in which said dielectric polymeric layer comprises a polymer selected from the group consisting of polycarbonates, polyimides, poly (ethersulfones) and polyacrylates.

19. The method of claim 17, comprising the further step of masking said dielectric polymeric layer prior to said step of forming source and drain electrodes, the step of masking including spirally winding a plurality of masking filaments onto said dielectric polymeric layer.

20. A method for making a fiber transistor, comprising the steps of:

providing an insulating fiber having an average diameter of less than about 5 millimeters;

forming a semiconductor layer and source and drain electrodes on said insulating fiber, said source and drain electrodes being in contact with said semiconductor layer;

forming a dielectric polymeric layer comprising a polymer having a main polymer chain on said semiconductor layer, the dielectric polymeric layer having a thickness of less than about 50 microns, said main polymer chain comprising carbon; and forming a gate electrode on said dielectric polymeric layer;

said fiber transistor having an on/off ratio of at least about 10.

* * * * *